United States Patent
Kashiwabara

(10) Patent No.: US 7,220,998 B2
(45) Date of Patent: May 22, 2007

(54) ELECTROLUMINESCENT ELEMENT

(75) Inventor: Mitsuhiro Kashiwabara, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 10/389,112

(22) Filed: Mar. 14, 2003

(65) Prior Publication Data

US 2003/0178621 A1    Sep. 25, 2003

Related U.S. Application Data

(62) Division of application No. 09/960,088, filed on Sep. 21, 2001, now Pat. No. 6,617,186.

(30) Foreign Application Priority Data

| Sep. 25, 2000 | (JP) | ............................. 2000-289946 |
| May 25, 2001 | (JP) | ............................. 2001-156787 |
| May 31, 2001 | (JP) | ............................. 2001-164212 |
| Jun. 5, 2001 | (JP) | ............................. 2001-169143 |

(51) Int. Cl.
*H01L 29/207* (2006.01)
(52) U.S. Cl. .............................. 257/93; 257/40; 257/79
(58) Field of Classification Search ................. 257/13, 257/40, 79, 84, 88, 89, 91, 93
See application file for complete search history.

(56) References Cited

U.S. PATENT DOCUMENTS

| 5,949,186 | A | * | 9/1999 | Nagayama et al. | ......... 313/504 |
| 5,953,585 | A | * | 9/1999 | Miyaguchi | ................... 438/35 |
| 6,013,384 | A | * | 1/2000 | Kido et al. | ................. 428/690 |
| 6,146,715 | A | * | 11/2000 | Kim et al. | ................... 427/555 |
| 6,294,892 | B1 | * | 9/2001 | Utsugi et al. | ............... 318/640 |
| 6,372,154 | B1 | * | 4/2002 | Li | ......................... 252/301.16 |

FOREIGN PATENT DOCUMENTS

| EP | 0961172 | 1/1999 |
| JP | 10-172766 | 6/1998 |
| JP | 10-503878 | 7/1998 |
| JP | 10-270167 | 10/1998 |
| JP | 11-8069 | 1/1999 |
| JP | 2000-113982 | 4/2000 |
| WO | WO97/38445 | 10/1997 |

* cited by examiner

*Primary Examiner*—Douglas M. Menz
(74) *Attorney, Agent, or Firm*—Ladas & Parry LLP

(57) ABSTRACT

The main object of the present invention is to provide a method for producing an EL element for realizing the high luminous efficiency, the high light takeout efficiency, the simplicity of the production process, and the formation of highly fine patterns. In order to achieve the above-mentioned object, the present invention provides a method for producing an EL element wherein at least one organic EL layer constituting the EL element is patterned by the use of a photolithography method.

1 Claim, 3 Drawing Sheets

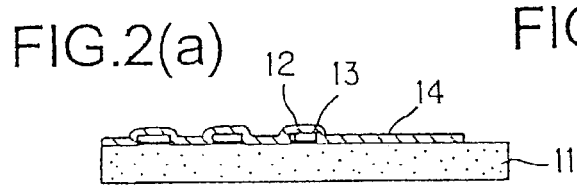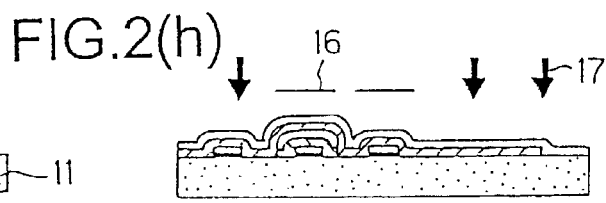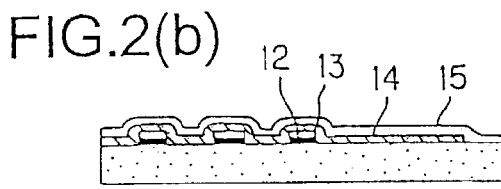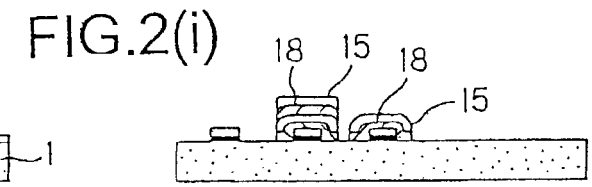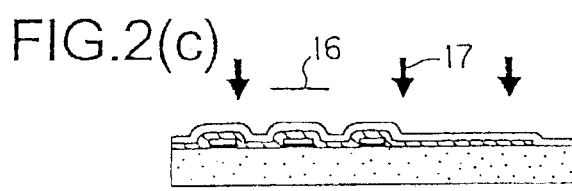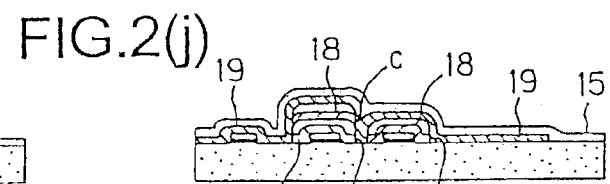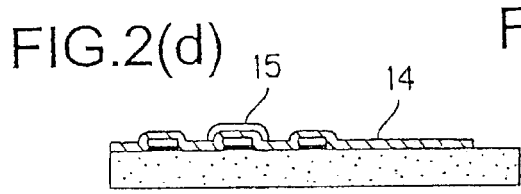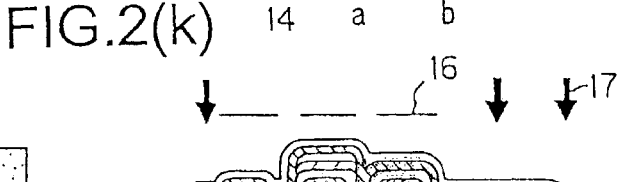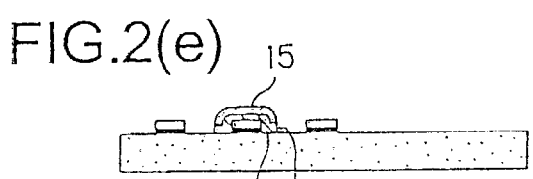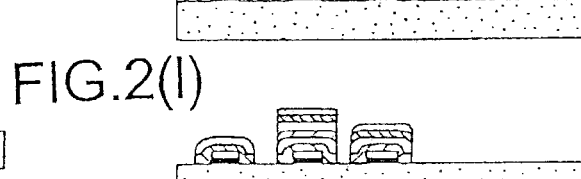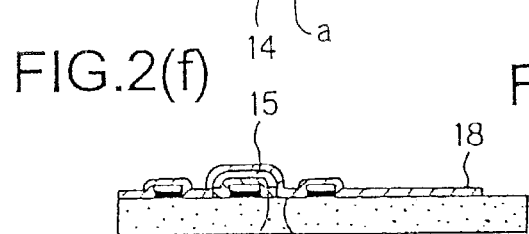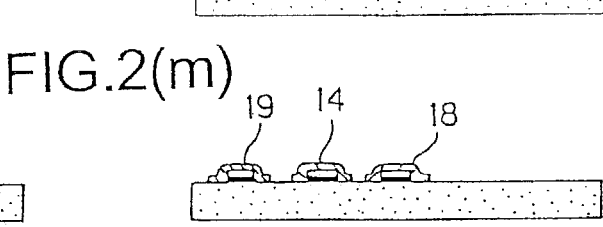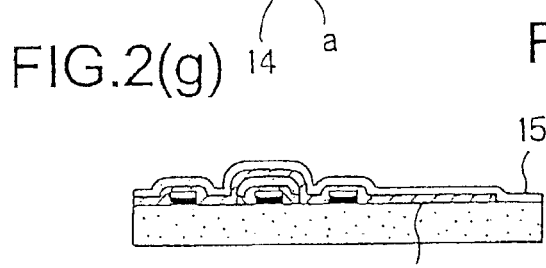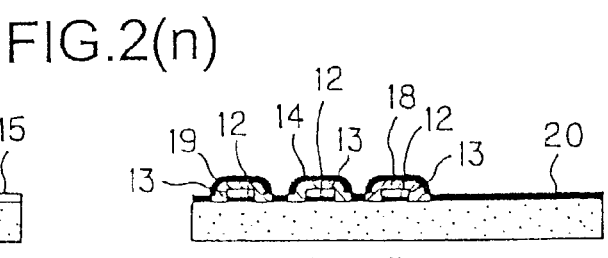

ELECTROLUMINESCENT ELEMENT

This application is a division of U.S. Ser. No. 09/960,088 filed Sep. 21, 2001 now U.S. Pat. No. 6,617,186, which U.S. application is hereby incorporated by reference.

BACKGROUND OF THE INVENTION

The present invention relates to a method for producing an electroluminescent element (may be referred to as an abbreviation of EL) in which a pattern is formed.

EL elements attract attention as spontaneously emitting flat panel display elements in which positive holes and electrons, which have been poured into from opposed electrodes, are combined in a luminous layer to generate energy, and the energy excites fluorescent material in luminous layer to emit light of a color corresponding to the fluorescent material. Among them, an organic thin film EL display using an organic material as a luminescent material has such a high luminous efficiency that high intensity luminescence can be realized even if applied voltage is a little less than 10 V, is possible to emit light with a simple element structure, and is expected to be applied to low-cost simple expression displays such as advertisements and the like in which specific patterns are emitted and displayed.

In the production of a display using such an EL element, patterning on an electrode layer and an organic EL layer is usually put into practice. Methods of EL element patterning include a vapor deposition method of a luminescent material via a shadow mask, a method of separately painting through inkjet, a method of destroying specific luminescent pigment through ultraviolet irradiation, a screen printing method, and others. However, these methods could not provide an EL element being possible to realize all of the high luminous efficiency, the high light takeout efficiency, the simplicity of the production process, and the formation of highly fine patterns.

The present invention has been achieved in order to solve the above-mentioned problems. It is a main object of this invention to provide a method for producing an EL element for realizing the high luminous efficiency, the high light takeout efficiency, the simplicity of the production process, and the formation of highly fine patterns.

SUMMARY OF THE INVENTION

In order to achieve the object mentioned above, the present invention provides a method for producing an EL element, wherein at least one organic EL layer constituting the EL element is patterned by the use of a photolithography method.

According to a method for producing an EL element in the present invention, because the EL element is obtained by patterning at least one organic EL layer within the EL element by the use of a photolithography method, when compared to the conventional vapor deposition patterning method, the EL element can be produced relatively easily and in low cost because no vacuum equipment with high precision alignment mechanism and others are needed. On the other hand, when compared to the patterning method by the use of an inkjet system, the production method of the present invention is preferable in the point of no need of carrying out preprocessing to constructions and substrates aiding patterning, and further the production method can be considered to be preferable to higher precision pattern forming because of the relationship to the discharge accuracy of an inkjet head. Thus, according to the EL element production method of the present invention, a highly fine EL element can be obtained relatively easily and in low cost.

In the above-mentioned invention, it is preferable that an organic EL layer made by patterning with the use of the above-mentioned photolithography method is a luminous layer. Because in an EL element, a luminous layer is an indispensable layer and can obtain a highly fine pattern that is needed in case of light emission.

Further, in the above-mentioned invention, it is preferable that the above-mentioned luminous layer is insoluble in a photoresist solvent, a photoresist developing solution, and a photoresist peeling liquid, and a photoresist is insoluble in a solvent that is used in forming the above-mentioned luminous layer. Although depending on the kinds of photolithography methods such as, for example, a method of using dry etching, a method of using a dry film and the like, in case where the general wet photolithography method is used, it is preferable to use a luminous layer and a photoresist that satisfy such requirements.

In addition, in the above-mentioned invention, it is preferable that the above-mentioned luminous layer is a luminous layer in which different types of luminous layers are formed by the use of the photolithography method in plural times. Because when the luminous layer is formed in different types of plural luminous layers, full coloring is possible, for example, by selecting red, green, blue and the like.

In this case, it is preferable that a solvent used for forming a luminous layer in the above-mentioned luminous layers, which are formed in two times and after, is a poor solvent to the previously formed luminous layer. Because a solvent for forming a luminous layer that is used in a luminous layer to be newly formed is a poor solvent to the previously formed luminous layer, so no mixed color will be caused when a luminous layer is further formed on the previously formed luminous layer.

In this case, it is preferable that the solubility of the previously formed luminous layer to the solvent used for forming luminous layers formed in two times and after is 0.1 g or less /g of solvent at 25° C. under 1 atmospheric pressure. This is the reason that, if the solubility is in this degree, even when a new luminous layer is formed on the previously formed luminous layer, the previously formed layer will not be dissolved in a solvent to cause mixed color.

Furthermore, it is also preferable that the above-mentioned luminous layers to be formed in plural times a reformed in the order of the short wavelength of light obtained from them.

Generally, when two kinds of a luminescent material emitting light of high energy short wavelength and a luminescent material emitting light of low energy long wavelength are mixed, the light emission from the luminescent material emitting light of long wavelength becomes to be main. In the present invention, since luminous layers are planned to be formed in the order of the short wavelength of light emitted from them, a luminescent material for a luminous layer to be formed later becomes to be a luminescent material emitting light of a long wavelength, and even if the luminescent material used for forming the previously formed luminous layer is mixed in a luminous layer to be formed later, the short wavelength luminescent material in the previously formed luminous layer that mixed in will hardly emit light, resulting in extremely lowering the possibility of causing problems like mixed color and others.

Like this, in case where luminous layers are formed in plural times, it is preferable that the above-mentioned luminous layers are three types of luminous layers emitting red, green and blue light. Because in order to make light emit in full color, it is generally preferable to make light emit in the three primary colors of red, green and blue.

Moreover, in the present invention, the above-mentioned organic EL layer that is made by patterning with the use of a photolithography method may be a buffer layer. In the present invention, it is preferable to use a photolithography method as mentioned above when a luminous layer is patterned, however the use of a photolithography method is not limited to this, the buffer layer may be patterned with the use of a photolithography. In particular, in an EL element in which a luminous layer is comprised of an organic polymer, it is preferable to combine a buffer layer and a luminous layer from the aspect of luminous efficiency, and on this occasion, through both layers are patterned with the use of a photolithography method, a cheap and high quality EL element can be produced.

In this case, it is preferable that the above-mentioned buffer layer is insoluble in a photoresist solvent and a photoresist peeling liquid, and a photoresist is insoluble in a solvent used for forming the above-mentioned buffer layer. This is the reason that, similarly to the case of a luminous layer as mentioned above, though depending upon the kinds of photolithography methods, it is necessary to satisfy the above-mentioned requirements in a photolithography method in which all procedures are carried out in wet conditions.

And, further, it is preferable that after a buffer layer that is insoluble in a photoresist solvent, a photoresist peeling liquid and a solvent to be used for forming a luminous layer is patterned and formed with the use of a photoresist that is insoluble in a solvent used in forming the buffer layer, a luminous layer that is insoluble in a photoresist solvent, a photoresist developing solution, and a photoresist peeling liquid is patterned and formed with the use of a photoresist that is insoluble in a solvent to be used in forming the luminous layer. As mentioned above, in an EL element in which a luminous layer is comprised of an organic polymer, it is preferable to combine a buffer layer with a luminous layer. Because it is preferable that in this case, a buffer layer that satisfies the above-mentioned requirements is first formed by a photolithography method, then a luminous layer that satisfies the above-mentioned requirements, is formed.

In the present invention, the above-mentioned patterning by the use of a photolithography method may be a patterning that after a photoresist is patterned in such away that the photoresist is applied on an organic EL layer to be patterned, exposed and developed, the organic EL layer in the part where the photoresist has been removed is removed with dry etching.

Because it becomes possible to form highly finer pattern by the use of a method with which an organic EL layer can be dry etched like this.

In this case, the above-mentioned dry etching is preferable to be reactive ion etching. It is because the organic EL layer can be effectively removed by the use of reactive ion etching.

Furthermore, it is preferable to use a simple substance of oxygen or a gas containing oxygen in the above-mentioned dry etching. Because the use of a simple substance of oxygen or a gas containing oxygen can effectively remove the organic EL layer without affecting on glass and ITO with oxidation reaction.

In addition, it is preferable to use atmospheric-pressure plasma in the above-mentioned dry etching. It is because the use of atmospheric-pressure plasma makes it possible to delete the vacuum process and to carry out patterning with high productivity.

Further, in the present invention, the above-mentioned patterning by the use of a photolithography method is preferable to be a patterning that after a photoresist is patterned in such a way that the photoresist is applied on an organic EL layer to be patterned, exposed and developed, the organic EL layer in the part where the photoresist has been removed is removed in an ultrasonic bath.

It is because the use of such a method makes it possible to carry out high precise patterning without problems including the narrowing of each pattern and the outflow of materials for the organic EL layer, in the patterning of the organic EL layer with the use of a photoresist.

The present invention provides an EL element having at least one patterned organic EL layer, and the EL element wherein that it does not have any of partition, a structure aiding patterning, and surface treatment aiding patterning.

The EL element of the present invention has an advantage of low cost because it does not have a partition and others like this.

Further, the present invention provides an EL element having at least one organic EL layer, and the above-mentioned EL element layer wherein it is a patterned luminous layer and the width of an area with uneven film thickness that is formed at the edge of the above-mentioned patterned luminous layer is 15 μm or less.

In the EL element of the present invention, because the width of an area with uneven film thickness is 15 μm or less, it is possible to make the distance between patterns to be small and to make a highly fine pattern. Here, "an area with uneven film thickness" indicates an area where the film thickness is decreased from that of a flat part, that is, an area where the film thickness is equal to or less than 90% of the average film thickness of the flat part.

Furthermore, the present invention provides an EL element having at least one organic EL layer, and the above-mentioned EL layer wherein it is plural luminous layers that can emit light with plural colors and the distance between adjacent luminous layers emitting different colors is 30 μm or less. Since the distance between pixels can be made small like this, a higher quality image can be displayed.

In these, it is preferable to have at least a substrate, an electrode layer formed on the above-mentioned substrate in the form of a pattern, and an insulating layer that is formed so as to cover the edge part of the above-mentioned electrode layer and the non-luminous layer of the element. Because it is possible to prevent shorts in parts unnecessary for luminescence and to decrease defects due to short of elements and the like to make an element that has a long life and can obtain stable luminescence.

According to the present invention, since the EL element is obtained by patterning at least one organic EL layer within the EL element by the use of a photolithography method, when compared to the conventional vapor deposition patterning method, the EL element can be produced relatively easily and in low cost because no vacuum equipment with alignment mechanism and others are needed. On the other hand, when compared to the patterning method by the use of an inkjet system, the production method of the present invention is preferable in the point of no need of carrying out preprocessing and others to constructions and substrates aiding patterning; and further the method can be considered to be preferable in the formation of higher precision patterns because of the relationship to the discharge accuracy of an inkjet head. Thus, according to the EL element production method of the present invention, a highly fine EL element can be obtained relatively easily and in low cost.

Further, according to the present invention, an EL element and the production method thereof will be provided for realizing all of the following subjects; no mixing of impurities in the luminous layer, the high luminous efficiency and the high light takeout efficiency, the simplification of production processes, the mass production system, the pattern formation being possible to emit highly fine and uniform light, and decreasing in crosstalk.

To be more concrete, for example, it is possible to decrease crosstalk in the drive of a simple matrix element by patterning a buffer layer. And, through patterning a buffer and luminous layers that are made by application, it is possible to carry out laser removal and insoluble part removal usually carried out by pulling out at the same time, and thus it is possible to simplify the processes. Further, it is also possible to simplify the processes from the viewpoint of the following fact; there is no need to use any of a partition, a structure having ink-repellent property to aid patterning and surface treatment having ink-repellent property to aid patterning. Moreover, the present invention is excellent in the points of being able to control and pattern the color of emitted light in any of an EL element emitting light in an optional pattern and an EL element emitting full color light, and further in an EL element using a flexible substrate.

BRIEF DESCRIPTION OF THE DRAWINGS

FIG. 2(a) through FIG. 2(n) shows another example of the production method of an EL element in the present invention, illustrating a flow diagram indicating the procedures of producing an EL element with full color display by carrying out the patterning of a luminous layer with three colors.

DESCRIPTION OF THE PREFERRED EMBODIMENTS

Figure 1A:
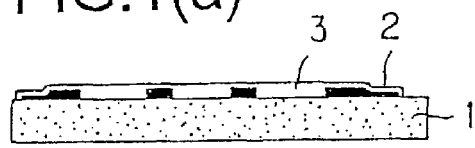
FIG. 1(a) through FIG. 1(l) shows one example of the production method of an EL element in the present invention, illustrating a flow diagram indicating the procedures of producing an EL element with single color by carrying out the patterning of a buffer layer.
Figure 1G:
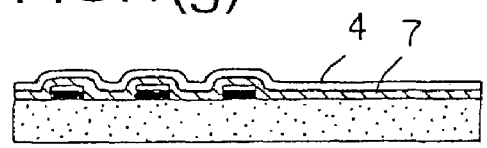
Figure 1B:
Figure 1H:
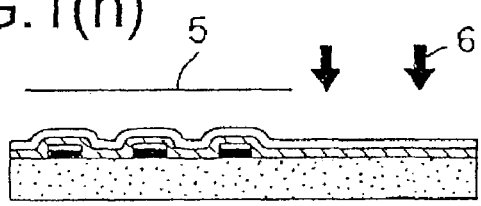
Figure 1C:
Figure 1I:
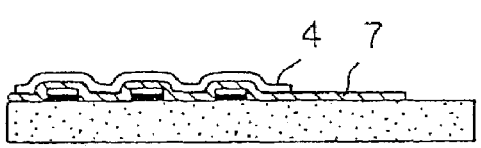
Figure 1D:
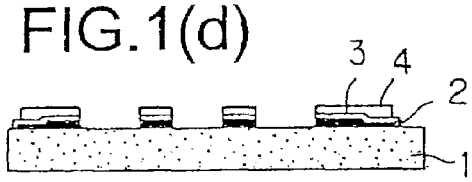
Figure 1J:
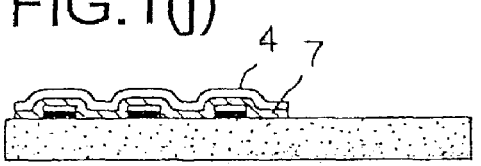
Figure 1E:
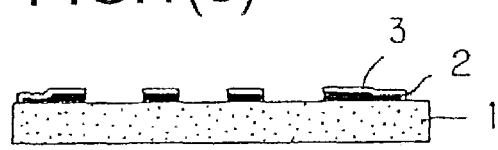
Figure 1K:
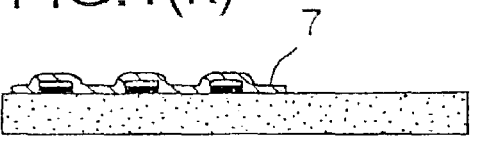
Figure 1F:
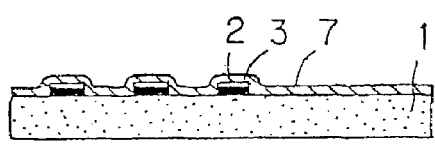
Figure 1L:
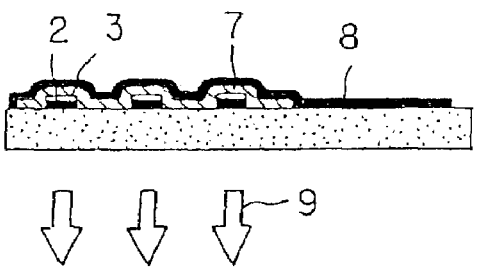

In the following, first the production method of an EL element in the present invention will be described, and then the EL element of the present invention that can be produced by the EL element production method and has such a new characteristics that cannot be found in usual elements will be described.

A. The Production Method of an EL Element.

The production method of an EL element in the present invention wherein at least one organic EL layer constituting an EL element is patterned by the use of a photolithography method.

In the production method of an EL element in the present invention, because at least one organic EL layer constituting an EL element is formed by a photolithography method, no vacuum device and the like are needed, and the patterning of the organic EL element can be carried out easily and at low cost when compared to the conventional vapor deposition method that is carried out through a shadow mask. On the other hand, when compared to the patterning by an inkjet method, highly fine patterning can be carried out without the pretreatment of a substrate and the necessity of setting liquid-repellent heights between patterns and others. That is, according to the production method of an EL element in the present invention, a high quality EL element having highly fine pattern can be obtained at low cost.

In the following, each composition in the production method of an EL element in the present invention will be described concretely.

(Organic EL Layer)

An EL element in the present invention has at least one patterned organic EL layer, and to be concrete, the EL element is comprised of at least the first electrode layer, an EL layer formed on the above-mentioned first electrode layer, and the second electrode layer formed on the above-mentioned EL layer, and at least one organic EL layer to be patterned is contained in the above-mentioned EL layer.

Here, at least a luminous layer is necessary to be included in the EL layer. In addition, a buffer layer, a positive hole transporting layer, a positive hole injection layer, an electron transporting layer, an electron injection layer and others may be combined.

Furthermore, the above-mentioned organic EL layer to be patterned may be any layer constituting the above-mentioned EL element, however in the present invention, a luminous layer or a buffer layer is preferable. Among them, a layer that a luminous layer is patterned as an organic EL layer is preferable from the viewpoint of exhibiting the effect of the present invention to the fullest. In addition, from the aspect of luminescence properties, this layer in which a luminous layer and a buffer layer are patterned as an organic EL element is considered to be the most preferable example.

To be concrete, a preferable example is such an EL layer that a buffer layer is patterned and formed on the first electrode layer as an organic EL layer by a photolithography method, further on the organic EL layer, a luminous layer is patterned and formed as an organic EL layer by a photolithography method, and further on the second organic EL layer, the second electrode layer is formed. In particular, the most preferable example is a full colored EL element in which the above-mentioned luminous layer is three kinds of luminous layers and is patterned and formed three times by a photolithography method.

In the present invention, the production method is characterized in that in case where such an organic EL layer is patterned, the patterning is carried out by the use of a photolithography method. And other layers can be produced by the method conventionally used.

(Photolithography Method)

The production method of the EL element of the present invention wherein the patterning of the above-mentioned organic EL layer is carried out by a photolithography method. The photolithography method is a method to form an optional pattern corresponding to an exposure pattern by the use of a property that the solubility of exposure part in a film is changed by exposure. In the following, the photolithography method will be described.

(Photoresists)

A photoresist that can be used in the present invention is not limited to a positive photoresistor a negative photoresist, but is preferable to be insoluble in a solvent to be used for forming an organic EL layer, including a luminous layer.

As photoresists that can be used concretely, photoresists of novolac resin series and rubber plus bisazide series can be listed.

(Photoresist Solvents)

In the present invention, as photoresist solvents to be used when the above-mentioned photoresist is coated, it is desirable to use such a solvent that does not dissolve organic EL materials, including luminous layer materials, in order to prevent the mixing and dissolving of the above-mentioned organic EL layer, including a luminous layer, and photoresist materials in case of the film formation of a photoresist and to keep original luminous properties. Considering this point, as photoresist solvents that can be used in the present invention, it is preferable to select a solvent that the solubility of materials for forming organic EL layer, including materials for forming luminous layers, is 0.001 or less (g/g solvent) at 25° C. under 1 atmospheric pressure, and more preferable to select a solvent that the above-mentioned solubility is 0.001 or less (g/g solvent).

For example, as solvents that can be used when a material for forming a buffer layer dissolves in a solvent of water series and a luminous layer dissolves in a nonpolar organic solvent, including aromatic series, the following solvents can be listed: ketones, including acetone and methyl ethyl ketone; cellosolve acetates, including propylene glycol monoethylether acetate, propylene glycol monomethylether acetate, ethylene glycol monomethylether acetate, ethylene glycol monoethylether acetate; cellosolves, including propylene glycol monoethyl ether, propylene glycol monomethyl ether, ethylene glycol monomethyl ether, ethylene glycol monoethyl ether; alcohols, including methanol, ethanol, 1-butanol, 2-butanol, cyclohexanol; ester solvents, including ethyl acetate, butyl acetate; cyclohexane, decalin, and others. However, solvents other than the listed solvents are also usable if they satisfy the requirements, and mixed solvents of two or more solvents may be used.

(Photoresist developing solutions)

Further, photoresist developing solutions that can be used in the present invention are not especially limited unless they do not dissolve materials forming the above-mentioned organic EL layers. To be concrete, organic alkaline developing solutions, which have been generally used, can be used, however in addition, inorganic alkali developing solution or aqueous solutions that can develop resists can be also used. After a resist is developed, it is preferable to wash the resist with water.

As a developing solution to be used in the present invention, it is preferable to use a developing solution that the solubility of materials for forming organic EL layer, including materials for forming luminous layers, is 0.001 or less (g/g developing solution) at 25° C. under 1 atmospheric pressure, and more preferable to select a developing solution that the above-mentioned solubility is 0.0001 or less (g/g developing solution).

(Photoresist Peeling Liquids)

Furthermore, as photoresist peeling liquids that can be used in the present invention, it is necessary to dissolve a photoresist layer without dissolving the above-mentioned organic EL layer, and photoresist solvents as mentioned above can be used as they are. And when a positive resist is used, it is also possible to peel off the resist by the use of a liquid listed as a resist developing solution after being subjected to UV exposure.

Moreover, it is also possible to use solvents, including strong alkali aqueous solution, dimethylformamide, dimethylacetamide, dimethylsulfoxide, and N-methyl-2-pyrrolidone, and their mixture, commercially available resist peeling liquid. After the resist is peeled off, it is rinsed with 2-propanol and the like, and further may be rinsed with water.

(Patterning Methods)

Patterning by a photolithography method used in the present invention is a method to pattern an organic EL layer and is concretely carried out as follows:

When a positive photoresist is used, after an organic EL layer is formed on the whole surface, a photoresist solution in which the above-mentioned photoresist material is dissolved in the above-mentioned photoresist solvent is coated whole on the surface and dried to form a photoresist layer in the first place. Then, this photoresist layer is subjected to pattern exposure and the photoresist on the exposed part is developed using a developing solution as mentioned above. By this developing, only the photoresist on the unexposed part is remained. And removing the organic EL layer on the part not covered with the photoresist patterns an organic EL layer.

Furthermore, a method to form the whole surface of an organic EL layer as mentioned above is similar to the method of forming a usual organic EL layer and is not especially limited. However, other than the vapor deposition method, many coating methods can be listed, that is, the electrodeposition method, the spin coating method in which a melting liquid, solution or mixed solution of material is used, the casting method, the dipping method, the bar coating method, the blade coating method, the roll coating method, the gravure coating method, the flexographic printing method, the spray coating method and the like.

In the photolithography method used in the present invention, as mentioned above, after a photoresist is coated on an organic EL layer to be patterned, exposed and developed, the organic EL layer on the part where the photoresist is removed may be removed by the use of dry etching.

Since a photoresist layer is usually formed in considerably thicker film than that in an organic EL layer, the organic EL layer can be removed by wholly carrying out dry etching.

In this case, the film thickness of the photoresist layer is preferable to be within the range of 0.1 to 10 μm, and more preferable to be within the range of 0.5 to 5 μm. When the film thickness is kept in such a range, dry etching with high processing accuracy can be achieved with holding the resist function of the photoresist.

Combining the dry etching method with a part of the photolithography method make it possible to make the edge part of etching more sharp. Consequently the width of uneven film thickness area existing at the edge part of the pattern can be made narrower. As a result, it will be confirmed that highly finer patterning is possible.

As a dry etching method used in the present invention, the dry etching is preferable to be a reactive ion etching. It is because that by the use of a reactive ion etching, an organic film is chemically reacted and decomposed to chemical compounds in small molecular weights, and that since these chemical compounds can be removed from the substrate by being evaporated and vaporized, it becomes possible to perform processing with high precision etching in short time.

Further, in the present invention, it is preferable to use a simple substance of oxygen or a gas containing oxygen in case of the above-mentioned dry etching. By the use of a simple substance of oxygen or a gas containing oxygen, it is possible to decompose and remove an organic film through the oxidation reaction, unnecessary organic matter can be removed from the substrate, and it is possible to perform processing with high precision etching in short time. Further, in this condition, because transparent oxide conductive films like usually used ITO and others are not etched, the dry etching is effective from the view point of purifying the surface of the electrode without injuring the electrode properties.

Moreover, in the present invention, it is preferable to use atmospheric-pressure plasma in the above-mentioned dry etching. By the use of atmospheric-pressure plasma, dry etching in which a vacuum device is usually necessary can be carried out under atmospheric pressure. AS a result, it is possible to shorten the processing time and decrease the cost. In this case, although the etching can utilize the phenomenon that organic matter is oxidized and decomposed by plasma oxygen in the air, it is also possible to control the gas composition in the reaction atmosphere by the substitution and circulation of the gas.

In the photolithography method used in the present invention, there may be such a patterning that after a photoresist is applied on an organic EL layer to be patterned, exposed and developed, the organic EL layer in the part where the photoresist has been removed is removed with the use of a solvent. The solvent to be used in this time is needed to dissolve or peel off the luminous layer without peeling off the photoresist, and any solvent satisfying the requirements can be selected other than the solvent to be applied on the luminous layer.

In the photolithography method used in the present invention, there may be such a patterning that after a photoresist is applied on an organic EL layer to be patterned, exposed and developed, the organic EL layer in the part where the photoresist has been removed is removed in an ultrasonic bath. The solvent to be used is needed to dissolve or peel off the luminous layer without peeling off the photoresist, and any solvent satisfying the requirements can be selected other than the solvent to be applied on the luminous layer.

It is because the use of such an ultrasonic bath makes it possible to carry out high accuracy patterning without problems, including the narrowing of each pattern and the outflow of materials for the organic EL layer, in the patterning of the organic EL layer with the use of a photoresist. Such a patterning is preferable from the viewpoint of being possible to perform a short-time patterning with high precision. Further, also in case where the above-mentioned photoresist is developed, this ultrasonic bath may be used.

In the present invention, as the ultrasonic conditions used in the ultrasonic bath, the bath is preferable to be used for 0.1 to 60 seconds at the frequency of oscillation of 20 to 100 kHz at 25° C. In such a conditions, a short-time patterning with high precision can be realized.

(Buffer Layer)

In the present invention, on an EL layer that is sandwiched between two electrode layers as mentioned above, at least one layer is needed to be an organic EL layer to be patterned and it is preferable to be formed by patterning a buffer layer or a luminous layer as an organic EL layer as mentioned above. In the following, first this buffer layer will be described.

A buffer layer in the present invention is a layer containing organic matter, especially an organic conductive material and the like, which layer is provided between the anode and a luminous layer or between the cathode and a luminous layer so that electric charges may be easily injected into the luminous layer. For example, a buffer may be a conductive polymer having a function of raising the injection efficiency of positive holes into the luminous layer and making the unevenness of electrodes and the like flat.

For a buffer layer to be used in the present invention, when its electric conductivity is high, the buffer layer is desirable to have been patterned so as to keep the diode properties of an element and to prevent crosstalk. Consequently, the buffer layer is desirable to be patterned and formed by the present invention. Moreover, when the resistance of the buffer layer is high and others, a buffer layer that has not been patterned maybe accepted. And in case of an element where a buffer layer can be eliminated, no buffer layer may be provided.

In the present invention, when both buffer layer and luminous layer are patterned and formed as the above-mentioned organic EL layer by a photolithography method, it is preferable to select a material for forming a buffer layer that is insoluble in a photoresist solvent and a solvent to be used for forming aluminous layer, more preferable to select a material for forming a buffer layer that is insoluble in a photoresist peeling liquid.

On the other hand, in case where a luminous layer is formed by vacuum film forming and the like and only a buffer layer is patterned as an organic EL layer by a photolithography method, it is preferable to select a material for forming a buffer layer that is insoluble in a photoresist solvent and a photoresist peeling liquid.

As materials for forming a buffer layer to be used in the present invention, to be concretely, polyalkyl thiophene derivatives, polyaniline derivatives, polymers of positive hole transport materials of triphenylamine and the like, sol-gel films of inorganic oxides, organic polymer films of trifluoromethane and the like, organic compound films containing Lewis acid, and others can be listed. However the materials are not especially limited if they satisfy the requirements on solubility as mentioned above, it is also acceptable to satisfy the above-mentioned requirements by reaction, polymerization or baking or the like after film formation. Further, when the film of a luminous layer is formed by the vacuum film formation and others, buffer materials, positive hole injection materials and positive hole transport materials, which are generally used, can be used.

Moreover, as solvents to be used for forming a buffer layer in the present invention, it is sufficient that the solvent can be disperse or dissolve the materials for forming a buffer layer and are not especially limited, however when plural times of film formation for buffer layers are needed in patterning and the like with full colors, it is necessary to use a solvent for a buffer layer that does not dissolve photoresist materials, and more preferable to use a solvent for a buffer layer that does not dissolve a luminous layer. As a solvent for a buffer layer that can be used in the present invention, it is preferable to select a solvent that the solubility of resist materials is 0.001 or less (g/g solvent) at 25° C. under 1 atmospheric pressure, and more preferable to select a solvent that the above-mentioned solubility is 0.0001 or less (g/g solvent). And it is more preferable for a solvent for a buffer layer to select a solvent that the solubility of luminous materials is 0.001 or less (g /g solvent) at 25° C. under 1 atmospheric pressure, and especially preferable to select a solvent that the above-mentioned solubility is 0.0001 or less (g/g solvent). For example, water, alcohols, including methanol and ethanol, dimethylformamide, dimethylacetamide, dimethylsulfoxide, N-methyl-2-pyrrolidone and others can be listed. However, solvents other than the listed solvents are also usable if they satisfy the requirements, and mixed solvents of two or more solvents may be used.

An example of patterning of a buffer layer with the use of a photolithography method like this will be described concretely with reference to FIG. 1.

FIG. 1 shows the procedure that a buffer layer and aluminous layer are patterned to produce an EL element with a single color by the method of the present invention. First, as shown in FIG. 1(a), buffer layer 3 is formed wholly on the first electrode layer 2 patterned on substrate 1. Next, as shown in FIG. 1(b), positive resist layer 4 is formed on buffer layer 3 and is prebaked. Next, as shown in FIG. 1(c), the surface is partly shielded the light with mask 5 and is subjected to ultraviolet pattern exposure 6. Next, as shown in FIG. 1(d), the surface is developed with a resist developing solution and then washed with water to remove the photoresist layer and the buffer layer of the exposed part. Next, as shown in FIG. 1(e), the pattern of buffer layer 3 covering the first electrode layer 2 can be formed by peeling off the resist with the use of the resist peeling liquid. Next, as shown in FIG. 1(f), luminous layer 7 is formed wholly on the first electrode layer 2 patterned on substrate 1 and on buffer layer 3 prepared on the first electrode layer 2. Next, as shown in FIG. 1(g), positive photoresist layer 4 is formed on luminous layer 7 and is prebaked. Next, as shown in FIG. 1(h), the surface is partly shielded the light with mask 5 and is subjected to ultraviolet pattern exposure 6. Next, as shown in FIG. 1(i), the surface is developed with a resist developing solution and then washed with water to remove the photoresist layer of the exposed part. Next, as shown in FIG. 1(j), uncovered patterned luminous layer 7 is removed by washing with a solvent for a luminous layer. Next, as shown in FIG. 1(k), the resist is peeled off with a resist peeling liquid. Lastly, as shown in FIG. 1 (l), the second electrode layer 8 is formed to produce an EL element that emits EL luminescence 9 downward in the figure.

(Luminous Layer)

In the next place, a luminous layer as an organic EL layer that is patterned and formed by the present invention will be described.

As materials to form a luminous layer like this, any material, as long as it contains a material emitting fluorescence and emits light emission, can be used and especially not limited. Although materials to form a luminous layer can possess both a light emission function and a positive hole transport function or an electron transport function, it is preferable that materials to form a luminous layer are insoluble in the above-mentioned photoresist solvent, the above-mentioned photoresist developing solution, and the above-mentioned photoresist peeling liquid. Further, in this case, as a material for a photoresist to be used when a luminous layer is patterned by a photolithography method, it is preferable to use a material that is insoluble in a solvent to be used for forming the luminous layer.

As materials to form a luminous layer that can be used in the present invention, for example, the following materials can be listed.

1. Materials of Coloring Matter Series.

As materials of coloring matter series, cyclopendamine derivatives, tetraphenylbutadiene derivatives, triphenylamine derivatives, oxadiazole derivatives, pyrazoloquinoline derivatives, distyrylbenzene derivatives, distyrylarylene derivatives, cyrol derivatives, thiophene cyclic compounds, pyridine cyclic compounds, perynone derivatives, perylene derivatives, oligothiophene derivatives, trifumanylamine derivatives, oxadiazole dimer, pyrazoline dimer, and others can be listed.

2. Materials of Metal Complex Series.

As materials of metal complex series, the following metal complexes and the like can be listed; aluminum quinolinol complexes, benzoquinolinol beryllium complex, benzoxazol zinc complex, benzothiazole zinc complex, azomethyl zinc complex, porphyrin zinc complex, europium complex, and others, which complexes have Al, Zn, Be and others, or rare-earth metals, including Tb, Eu, and Dy, as keymetals, and have oxadiazol, thiadiazol, phenylpyridine, phenylbenzoimidazole, quinoline structures and others as ligands.

3. Materials of Polymer Series.

As materials of polymer series, polyparaphenylene vinylene derivatives, polythiophene derivatives, polyparaphenylene derivatives, polysilane derivatives, polyacethylene derivatives, polyfluorene derivatives, polyvinylcarbazole derivatives, the above-mentioned coloring matter series materials, polymerized materials of metal complex series luminescent materials, and others can be listed.

In the present invention, it is more preferable to use the above-mentioned polymer series materials as luminescent materials from the viewpoint of making the best use of the advantage that a luminous layer can be formed with high precision by a photolithography method with the use of a coating liquid for a luminous layer.

4. Doping Materials.

Doping can be carried out for the purpose of improving the luminous efficiency in a luminous layer and of changing the wavelength of emitted light. As this doping materials, for example, perylene derivatives, coumarin derivatives, rubrene derivatives, quinacridon derivatives, squalium derivatives, porphyren derivatives, styryl series coloring matter, tetracene derivatives, pyrazoline derivatives, decacyclene, phenoxazone, and others can be listed.

5. Solvents Used for Forming a Luminous Layer.

When used together with a buffer layer, solvents used for forming a luminous layer is desirable not to dissolve a buffer layer so as to prevent the mixing or dissolving of a buffer layer and materials for a luminous layer and to hold original luminous properties of luminescent materials in case of the film formation for the luminous layer.

From this point of view, as a solvent for being applied to a luminous layer, it is preferable to select such a solvent that the solubility of materials for a buffer layer is 0.001 or less (g/g solvent) at 25° C. under 1 atmospheric pressure, and more preferable to select a solvent that the above-mentioned solubility is 0.0001 or less (g/g solvent).

Further, when plural layers of a luminous layer are applied, solvents used for forming a luminous layer is desirable not to dissolve a photoresist layer so as to prevent from the mixing or dissolving of the photoresist layer and materials for a luminous layer and further to protect a luminous layer that has been already patterned in case of the film formation of the second color and after for the luminous layer.

From this point of view, as a solvent for being applied to a luminous layer, it is preferable to select such a solvent that the solubility of a photoresist is 0.001 or less (g/g solvent) at 25° C. under 1 atmospheric pressure, and more preferable to select a solvent that the above-mentioned solubility is 0.0001 or less (g/g solvent). For example, in case where a buffer layer dissolves in polar solvents, including water series, DMF, DMSO, and alcohol, and a photoresist is a general positive resist of novolac series, the following solvents can be listed: aromatic solvents, including each isomer and their mixtures of benzene, toluene and xylene, and each isomer and their mixtures of mesitylene, tetralin, p-cymene, cumene, ethylbenzene, diethylbenzene, butylbenzene, chlorobenzene, and dichlorobenzene; ether solvents, including anisole, phenetole, butylphenyl ether, tetrahydrofuran, 2-butanone, 1,4-dioxane, diethyl ether, diisopropyl ether, diphenyl ether, dibenzyl ether, and diglyme; chlorine solvents, including dichloromethane, 1,1-dichloroethane, 1,2-dichloroethane, trichloroethylene, tetrachloroethylene, chloroform, carbon tetrachloride, and 1-chloronaphthalene; and cyclohexanone and others. However, solvents other than the listed solvents are also usable if they satisfy the requirements, and mixed solvents of two or more may be used.

(When Plural Types of Luminous Layers are Formed)

In the present invention, it is preferable that the above-mentioned luminous layer is a luminous layer in which different types of luminous layers are formed by the use of the photolithography method in plural times. It is because when the luminous layer is formed in different types of plural luminous layers, full coloring is possible, for example, by selecting red, green, blue and the like.

In this case, for the reasons shown in the following, it is preferable that a solvent used for forming luminous layers in the above-mentioned luminous layer, which are formed in two times and after, is a poor solvent to the previously formed luminous layer. Now, the term of "poor solvent" in the present invention means a solvent having a small capacity of dissolving a solute.

That is, when paint for forming a luminous layer is further applied on an luminous layer that has previously been formed (in the following, may be referred to as a previously formed luminous layer) to form a luminous layer, because a resist layer is normally formed on the previously formed luminous layer, the paint for forming a luminous layer does not contact the previously formed luminous layer completely. However, since the edge parts of the previously formed luminous layer are normally not covered with the resist layer, the paint for forming a luminous layer contacts the previously formed luminous layer at these points. In case of contact like this, when the previously formed luminous layer easily dissolves in a solvent contained in the paint for forming a luminous layer, the luminescent material of the previously formed luminous layer will dissolve in the paint for forming a luminous layer to cause a color mixture. The present invention has been made to solve problems like this, and has solved the above-mentioned problem by the use of a poor solvent to the previously formed luminous layer as a solvent for forming a luminous layer.

FIG. 2 shows an example of production methods of an EL element in the present invention. In this example, first, as shown in FIG. 2(a), the first patterned electrode layer 12 and buffer layer 13 are formed on substrate 11. This buffer layer will be described in detail later.

And paint for forming the first luminous layer is applied wholly on these by the use of a spin coating method and the like. This paint for forming the first luminous layer is comprised of at least a luminescent material emitting a light of the first color and a solvent, and of a doping agent and others that are added as needed. The paint for forming the first luminous layer wholly applied is dried and cured to form the first luminous layer 14 (FIG. 2(a)).

Next, positive resist is applied wholly on the first luminous layer 14 to form positive resist layer 15 (FIG. 2(b)), which positive layer is then subjected to the pattern exposure of ultraviolet 17 with the use of photomask 16 so as not to expose the part that will form the first luminous layer 14 (FIG. 2(c)) And the exposed part of positive resist layer 15 is developed with a developing solution and washed with water to remove positive resist layer 15 on the exposed part as shown in FIG. 2(d). And by being developed with a developing solution for a luminous layer, only the first luminous layer 14 on the part not covered with positive resist layer 15 is removed, remaining positive resist layer 15 and the first luminous layer 14 covered with the layer 15 (FIG. 2(e)). Moreover, the development of the luminous layer at this time can be carried out with the use of dry etching as described later.

Next, paint for forming the second luminous layer is applied wholly on these by the use of a spin coating method and the like (FIG. 2(f)). Similarly to the above-mentioned paint for forming the first luminous layer, this paint for forming the second luminous layer is also comprised of a luminescent material and a solvent, and further of a doping agent and others that are added as needed. However, a solvent for forming a luminous layer that is used in the second luminous layer is selected to be a poor solvent to the first luminous layer.

On this occasion, as clearly seen from FIG. 2(f), there are yielded parts where the above-mentioned wholly applied paint for forming the second luminous layer and the first luminous layer 14 are contacted. That is, as mentioned above, the surface of the first luminous layer 14 remaining on the substrate 11 is covered with positive resist layer 15, the edge part "a" that has been developed with a luminous layer developing solution is in an exposed state. Consequently, when the above-mentioned paint for forming the second luminous layer is applied, the first luminous layer 14 and the paint for forming the second luminous layer are contacted at this edge part "a". On this occasion, since the paint for forming the second luminous layer is using such a solvent for forming a luminous layer as to be a poor solvent to the first luminous layer, the amount that the first luminous layer, especially luminescent materials are eluted into the above-mentioned solvent for forming the second luminous layer is extremely small.

And, though the second luminous layer 18 is formed by drying and solidifying the above-mentioned paint for forming the second luminous layer, the eluted amount of the component of the first luminous layer 14, especially the luminescent materials of the first luminous layer 14 within the second luminous layer 18 is extremely small, so it is possible to extremely lower the possibility of occurring problems like color mixture and the like in the second luminous layer 18.

Next, as shown in FIG. 2(g), positive resist layer 15 is formed on the whole surface, and as shown in FIG. 2(h), photomask 16 is arranged so as to mask parts where the first and the second luminous layer are formed, and then the surface is exposed with ultraviolet 17. And the exposed surface is developed with a resist developing solution and washed with water to remove other parts except for positive resist layers on the parts where the first and the second luminous layer are to be formed. After that, the exposed second luminous layer is removed with the second luminous layer developing solution. On this occasion, in the second luminous layer developing solution, a solvent that is a poor solvent to the first luminous layer is selected and used. This is because it is possible to avoid problems of color mixture and the like by the use of a poor solvent to the first luminous layer as a solvent in the above-mentioned second luminous layer developing solution, since the second luminous layer developing solution and the first luminous layer are contacted at the edge part "a" in the above-mentioned first luminous layer when the second luminous layer is developed.

By being developed with the second luminous layer developing solution, as shown in FIG. 2(i), only the second luminous layer 18 on the part where positive resist layer 15 has not been remained is removed, and only the part covered with positive resist layer 15 is remained. Further, in the developing process of the second luminous layer 18, it is possible to use a dry etching method that will be described later.

Moreover, similarly to the formation of the first and the second luminous layer, paint for forming the third luminous layer is applied on the whole surface by the use of a spin coating method and the like. Similarly to the above-mentioned paint for forming the first and the second luminous layer, the paint for forming the third luminous layer at this time is also comprised of a luminescent material and a solvent, and further of a doping agent that is added as needed and others. Further, a solvent for forming the third luminous layer that is used at this time is selected to be a poor solvent to the above-mentioned first luminous layer 14 and the second luminous layer 18.

When the paint for forming the third luminous layer was applied, for example, as shown in FIG. 2(j), the applied paint for forming the third luminous layer contacts the first luminous layer at the edge part "a" of the first luminous layer 14 that was first formed and further contacts the second luminous layer at the edge part "b" and the edge part "c" of the second luminous layer 18. At this time, similarly, since the solvent for forming the third luminous layer becomes a poor solvent to the first luminous layer 14 and the second luminous layer 18, the amount that the above-mentioned first luminous layer 14 and the second luminous layer 18 are eluted into the paint for forming the third luminous layer becomes extremely small. Consequently, after this, when the paint for forming the third luminous layer is dried and solidified to form the third luminous layer 19, such problems as color mixture and the like will not be yielded in the third luminous layer 19.

Next, positive resist layer 15 is formed whole on the third luminous layer 19 (FIG. 2(j)). And, as shown in FIG. 2(k), photomask 16 is arranged so as to mask parts where the first, the second and the third luminous layer are formed, and then the surface is exposed with ultraviolet 17. This is developed with a resist developing solution and washed with water. And, though the development is carried out with the use of the third luminous layer developing solution, at this time, similarly, in the third luminous layer developing solution, a solvent that becomes a poor solvent to the above-mentioned first luminous layer 14 and the second luminous layer 18, especially to each luminescent material is selected and used. Consequently, also in this developing process of the third luminous layer, it is not possible that the first luminous layer 14 and/or the second luminous layer 18, especially their luminescent materials elute in the developing solution to cause troubles, including color mixture.

Through the development of the third luminous layer 19 with the third luminous layer developing solution like this, as shown in FIG. 2(l), only the third luminous layer 19 on the part not covered with positive resist layer 15 is removed, and other parts covered with positive resist layer 15 are remained.

And, upper layers on the part where the resist is formed are peeled off through peeling treatment with a resist peeling liquid, and as shown in FIG. 2(m), bare three colored luminous layers of the first luminous layer 14 (normally blue), the second luminous layer 18 (normally green), and the third luminous layer 19 (normally red) are formed. Lastly, as shown in FIG. 2(n), the second electrode layer 20 is formed on these luminous layers to produce an EL element that emits EL light emission 21 downward in the figure.

In the present invention, the term of poor solvent indicates a solvent for forming a luminous layer of the luminous layers formed in the second time and after that the solubility of materials constituting a previously formed luminous layer is 0.1 g/g solvent or less at 25° C. under 1 atmospheric pressure. Especially in the present invention, the above-mentioned solubility is preferable to be 0.05 g/g solvent or less.

It is because if the solubility is in this degree, when materials constituting a previously formed luminous layer dissolve in a solvent for forming aluminous layer of anew luminous layer to be formed and the materials constituting the previously formed luminous layer are mixed into the newly formed luminous layer, the amount is extremely small, there will be no trouble like color mixture.

Moreover, in the present invention, when luminous layers are formed in plural times by a photolithography method, these plural luminous layers are preferable to be formed in the order of the short wavelength side relative to the wavelength of light obtained from each luminous layer. The reasons are as follows:

That is, usually, when two or more colors are mixed, the excitation energy is moved from an exciton in a high level to an exciton in a low level in a fluorescent luminescent material, and fluorescence from the lowest excitation state is observed. In other words, when a shorter wavelength luminescent component with high energy and a long wavelength luminescent component with low energy are mixed, luminescence from the long-wavelength luminescent component becomes to constitute the main part of luminescence. The present invention utilizes such a property of a luminescent material, and through forming luminous layers in the order of the short wavelength of light emitted from them, the second luminous layer formed with a long wavelength luminescent material is formed on the first luminous layer previously formed with a short wavelength luminescent material. Consequently, when the film of the second luminous layer is formed on a substrate where the above-mentioned first luminous layer has been patterned, even if part of the luminescent material elutes from the edge part of the patterned first luminous layer and mixes into the second luminous layer, the excitation energy of the luminescent material in the first luminous layer moves and only luminescence from the second luminous layer is observed. As a result, it is possible to minimize the lowering of luminescent properties.

This point will be further described with reference to the above-mentioned FIG. 2. The descriptions from FIG. 2(a) to FIG. 2(e) will be omitted here because they are the same as the above-mentioned descriptions. In FIG. 2(f), paint for forming the second luminous layer is applied on the whole surface by the use of a spin coating method and the like. The paint for forming the second luminous layer to be used at this time is comprised of, similarly to the paint for forming the first luminous layer as mentioned above, a luminescent material and a solvent, and further of a doping agent and others that are added as needed, however the luminescent material is selected so that the wavelength of light emitted from the luminescent material used in the second luminous layer is longer than that of light emitted from the luminescent material used in the above-mentioned first luminous layer.

At this time, clearly seen from FIG. 2(f), there is produced part where the above-mentioned paint for forming the second luminous layer applied on the whole surface and the first luminous layer 14 are contacted. That is, though the surface of the first luminous layer 14 remained on the substrate 11 is covered with positive resist layer 15 as mentioned above, the edge part "a" that has been developed with a luminous layer developing solution is in a exposed state. Consequently, when the above-mentioned paint for forming the second luminous layer is applied on this, the first luminous layer 14 and the paint for forming the second luminous layer are contacted at the edge part "a". At this time, since the paint for forming the second luminous layer contains a solvent as mentioned above, though depending upon the solubility of this solvent and the luminescent material contained in the first luminous layer, a part of the luminescent material in the first luminous layer may be eluted in the above-mentioned paint for forming the second luminous layer. If the second luminous layer 18 is formed by drying and solidifying in the state that the luminescent material of the first luminous layer is eluted in the paint for forming the second luminous layer, the second luminous layer 18 will contain the luminescent material in the first luminous layer. However, in this example, since the luminescent material in the first luminous layer and luminescent material in the second luminous layer are selected on the basis as mentioned above, that is, the wavelength of the light emitted from the luminescent material of the first luminous layer will be shorter than that of the light emitted from the luminescent material of the second luminous layer, even if the luminescent material of the first luminous layer is mixed in the second luminous layer, for the above-mentioned reason, it is possible to lower the possibility of light emission from the luminescent material of the first luminous layer in the second luminous layer.

After that, about FIG. 2(g) and FIG. 2(i), the same process as the above description will be performed. And, similarly to the formation of the first and second luminous layers, paint for forming the third luminous layer is applied on the whole surface with the use of a spin coating method and the like. Similarly to the above-mentioned paints for forming the first and second luminous layers, the paint for forming the third luminous layer at this time has also a luminescent material and a solvent, and further a doping agent that is added as needed. And luminescent materials to be used at this time are selected so that the wavelength of the fluorescence from the luminescent material used in the third luminous layer will be longer than that of the luminescence from the luminescent material used in the above-mentioned first luminous layer and the above-mentioned second luminous layer.

Like this, when paint for forming the third luminous layer is applied, for example, as shown in FIG. 2(j), the applied paint for forming the third luminous layer is contacted with the first luminous layer at the edge part "a" of the first luminous layer 14 that was formed for the first time, and further with the second luminous layer at the edge part "b" and the edge part "c" of the second luminous layer 18. At this time, it is also possible that the luminescent material in the first luminous layer and the luminescent material in the second luminous layer dissolve in the solvent in the paint for forming the third luminous layer to elute in the paint for forming the third luminous layer. Also in this case, because the luminescent material in the above-mentioned third luminous layer is selected so that the wavelength of the fluorescence emitted from the luminescent material will be longer than that of the luminescence emitted from the luminescent material in the first luminous layer and the luminescent material in the second luminous layer, for the above-mentioned reason, there is a low possibility that the luminescent material of the first luminous layer and the luminescent material of the second luminous layer emit light within the third luminous layer, resulting in decreasing the anxiety of causing color mixture.

In the present invention, it is preferable to apply luminescent materials for forming luminous layers in the order of the short wavelength of the light emitted from them. To be concretely, usually in order to obtain a full color image, luminescent materials to emit red fluorescence, green fluorescence, and further blue fluorescence are used as luminescent materials, however when these luminescent materials are used, it is preferable that luminous layers containing these luminescent materials are applied and formed so that these luminescent materials are in the order of the short wavelength, that is, in blue color, green color and red color order.

Here, as luminescent materials to emit blue fluorescence that can be used in the present invention, distyrylbenzene derivatives, oxadiazol derivatives, and their polymers, polyvinylcarbazole derivatives, polyparaphenylene derivatives, polyfluorene derivatives, and others can be listed. Among them, polymer materials of polyvinylcarbazole derivatives, polyparaphenylene derivatives, polyfluorene derivatives, and others are preferable, however not especially limited to them.

And, as luminescent materials to emit green fluorescence, quinacridon derivatives, coumarin derivatives, and their polymers, polyparaphenylenevinylene derivatives, polyfluorene derivatives, and others can be listed. Among them, polymer materials of polyparaphenylene vinylene derivatives, polyfluorene derivatives, and others are preferable, however not especially limited to them.

Further, as luminescent materials to emit red fluorescence, coumarin derivatives, thiophene cyclic compounds and their polymers, polyparaphenylene vinylene derivatives, polythiophene derivatives, polyfluorene derivatives, and others can be listed. Among them, polymer materials of polyparaphenylene vinylene derivatives, polythiophene derivatives, polyfluorene derivatives, and others are preferable, however not especially limited to them.

(Other Organic EL Layers)

1. Electric charge transporting layer

AS an organic EL layer in the present invention, an electric charge injection layer can also be listed. The electric charge injection layer includes a positive hole injection layer and an electron injection layer. They are not especially limited as long as they are generally used in EL elements as those described in, for example, Japanese Patent Application Laid-Open No. 11-4011.

Moreover, a luminescent material, a positive hole transporting material, or an electron transporting material constituting the above-mentioned layer may be used independently each or in a mixture. The same material may be contained either in one layer or in plural layers.

2. Electrode Layer

In the present invention, an electrode layer is generally not limited as long as it is used in an EL element, and an electrode layer first provided on a substrate may be referred to as the first electrode layer and an electrode layer provided after forming an organic EL layer as the second electrode layer. These electrode layers are comprised of an anode and a cathode, one of which is transparent or semitransparent, and the anode is preferable to be a conductive material having a large work function so that positive holes are easily injected. Moreover, plural materials may be mixed in these electrodes. Both electrode layers are preferable to have as low resistance as possible. Generally, metal materials are used, however organic materials or inorganic materials may be used.

As preferable anode materials, for example, ITO, iridium oxide, and gold are listed. As preferable cathode materials, for example, magnesium alloys (MgAg and others), aluminum alloys (AlLi, AlCa, AlMg and others), calcium metal, and metals having low work functions are listed.

3. Insulation Layer

In the EL element of the present invention, in order to cover the patterned edge part of the first electrode layer formed on the substrate and the non-luminous part of the element to prevent a short at the part unnecessary for luminescence, an insulation layer may be provided in advance so that the luminous part will be open. Thus, it is possible to obtain an element with a long life and stable luminescence by decreasing the defects due to the short of elements and the like.

As generally known, for example, it is possible to form a pattern of about 1 μm in thickness with the use of an ultraviolet curing resin material and the like, however when an organic EL layer is patterned by the dry etching of the present invention, the insulation layer is preferable to be resistant to dry etching. When the resistance is low, it is preferable to form the insulation layer in 1 μm or more, for example, 1.5 to 10 μm in thickness and to prevent the damage due to dry etching, more preferable to form the layer in 2 to 5 μm in thickness.

B. EL Element.

Next, the EL element of the present invention will be described. The EL element of the present invention has three embodiments as described later, and all of them can be produced by the above-mentioned production method of an EL element. In the following, each embodiment will be described.

(First Embodiment)

The first embodiment of the EL element of the present invention is an EL element having at least one patterned organic EL layer, and is characterized in that the EL element does not have any of a partition, a structure aiding patterning, and surface treatment aiding patterning.

Though the EL element of the present embodiment has an patterned organic EL layer, it does not have any of a partition, a structure aiding patterning, and surface treatment aiding patterning. Consequently, it has an advantage that it is advantageous in respect of cost.

In the present embodiment, the above-mentioned organic EL layer is preferable to be an EL layer formed by a polymer material, because the layer cannot be formed by the vapor deposition method. And the above-mentioned organic EL layer is preferable to be a luminous layer in which especially patterning is indispensable.

Concerning other constitutions, the description will be omitted because they are the same as those described in the production method of the above-mentioned EL element.

(Second Embodiment)

The second embodiment of the EL element of the present invention is an EL element having at least one organic EL layer, the above-mentioned organic EL layer is a patterned luminous layer and is characterized in that the width of an area with uneven film thickness formed on the edge part of the above-mentioned patterned luminous layer is 15 μm or less, preferable 10 μm or less, and especially preferable 7 μm or less. Here, the term of "an area with uneven film thickness" indicates an area that exists on the edge part and the film thickness is equal to or less than 90% of the average film thickness of the flat part.

In the EL element obtained by the above-mentioned production method of an EL element, the luminous layer that is patterned by the photolithography method is different from the luminous layer that is patterned by the inkjet method and others and is highly uniform in thickness, and the shape of an edge on the peripheral area of the luminous layer can be freely controlled by etching conditions. Consequently, it is possible to adjust the width of an edge area, that is, an area with uneven film thickness to such a shape that the edge is stood straight, that is, the width of the area with uneven film thickness is narrowed or to such a shape that the edge is made to be taper, that is, the width of the area with uneven film thickness is broadened.

On the other hand, the area with uneven film thickness of the luminous layer that is patterned by the conventional inkjet method usually has a width of more than 15 μm. Consequently, it was difficult to minutely arrange pixels constituting each color formed by patterning like this.

Figure 3:
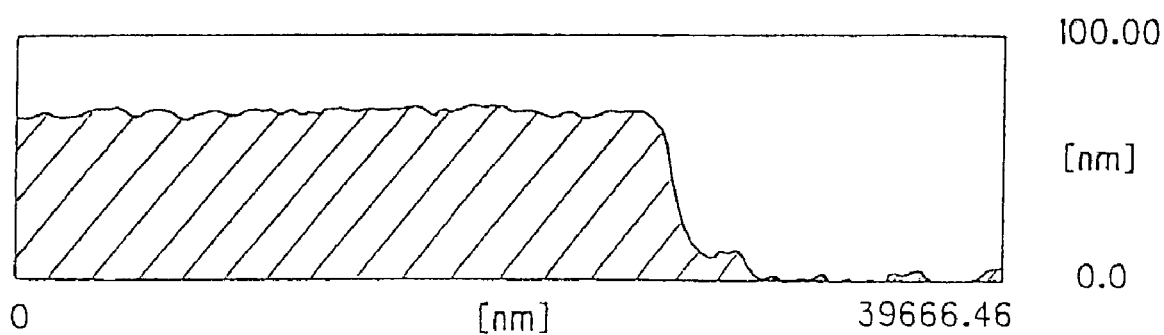
FIG. 3 is an expanded sectional view showing the expanded section of the edge part of a luminous layer in an EL element of the present invention.
Figure 4:
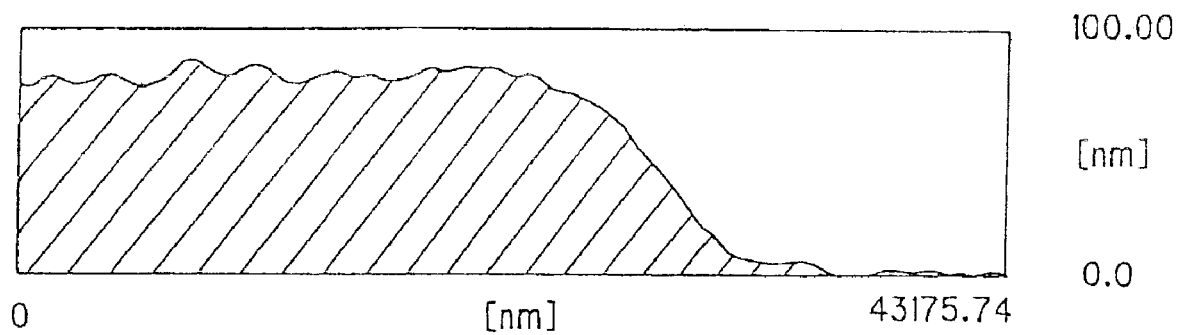
FIG. 4 is an expanded sectional view showing the expanded section of the edge part of a luminous layer formed by the conventional inkjet method.

Here, FIG. 3 shows the area with uneven film thickness, that is, the edge part in the luminous layer of an EL element of the present invention, and FIG. 4 shows the area with uneven film thickness in the luminous layer patterned by the conventional inkjet method. As clearly seen from these figures, the area with uneven film thickness of the edge part in the luminous layer that is patterned by the conventional inkjet method is broad, however the area with uneven film thickness in the luminous layer of the EL element of the present invention is considerably narrow.

In the EL element in the present embodiment, because the width of the area with uneven film thickness of the edge part in the luminous layer is not more than the above-mentioned value, it is possible to make the distance between each pixel small. Thus, this embodiment has advantages that it is possible to arrange each pixel minutely and to make an EL element by which an image with high quality can be obtained.

In the present embodiment, a material to form a luminous layer is preferable to be an organic polymer material that cannot be formed by the vapor deposition method. And, the luminous layer is preferable to be constituted in at least three layers so that a full color image can be obtained. Further, concerning other constitutions, materials and others, the description will be omitted because they are the same as those described in the production method of the above-mentioned EL element.

(Third Embodiment)

The third embodiment of the EL element of the present invention is an EL element having at least one organic EL layer and characterized in that the above-mentioned organic EL layer is a patterned luminous layer that can emit light with plural colors and the distance between adjacent luminous layers emitting light with different color is 30 μm or less, preferable 20 μm or less, and especially preferable 15 μm or less.

Further, here the distance between luminous layers indicates the space between pixels consisting of each patterned luminous layer.

In the inkjet method that is the most well known wet patterning method for a luminous layer, it is general to prepare usually the distance between patterned luminous layers of at least 40 μm or more, because the film uniformity is low at the edge part, the adhered position of jetted ink is unstable, and because it is necessary to prepare ink-repellent banks or to form ink-repellent patterns in order to define the range where ink wet and spread, and others. Consequently, it is impossible to carry out the patterning of an element with small pixel pitch like, for example, 42 μm or less.

On the other hand, the EL element in the present embodiment is an EL element that a high molecular weight or low molecular weight luminous layer can be produced by wet film formation, the patterning accuracy of the luminous layer is high, and because the edge part of the patterned luminous layer is different from the edge that is formed by drying and is formed using the technique of removing unnecessary parts by dissolving or etching, the film uniformity in the luminous layer is high and there is only a inclined area of, for example, about 5 μm from the patterned end. Consequently, when a full color display is manufactured, each distance between pixels of luminescence parts can be made to be small, it is thus possible to make the active area ratio large. Further, since the distance between pixels can be made to be small, it is possible to arrange each pixel minutely.

In the present embodiment similarly to the second embodiment, a material to form a luminous layer is preferable to be an organic polymer material that cannot be formed by the vapor deposition method. And, the luminous layer is preferable to be constituted in at least three layers so that a full color image can be obtained. Further, concerning other constitutions, materials and others, the description will be omitted because they are the same as those described in the production method of the above-mentioned EL element.

(Others)

In EL elements shown in the above-mentioned first, second and third embodiments, the element is preferable to be made in a constitution having at least a substrate, an electrode layer formed in a pattern shape on the above-mentioned substrate, and an insulation layer covering the edge part of the above-mentioned electrode layer and the nonluminous part of the element.

It is because defects due to the short of elements and the like can be decreased as mentioned above by covering the edge part of the electrode layer formed in such a pattern shape with an insulation layer.

As a substrate to be used here, as long as such a substrate of glass and the like as is usually used in an EL element is used, it is not especially limited.

Further, concerning an electrode layer and an insulation layer, the description will be omitted because they are the same as those described in the column of the production method of the above-mentioned EL element.

(Concrete Combinations of Materials)

Suitable combinations of materials with which the patterning of the EL element in the present invention can be carried out utilizing their solubility in the above-mentioned specific solvents are, for example, as follows:

Buffer layer: Polyalkylthiophene derivatives, polyaniline derivatives.

Luminous layer: Polyparaphenylene vinylene derivatives, polyfluorene derivatives, polyvinylcarbazole derivatives.

Photoresist: Positive photoresist (novolac resins).

Photoresist solvent: Cellosolve, cellosolve acetate.

Photoresist developing solution: Organic alkali developing solution.

Photoresist peeling liquid: Cellosolve, cellosolve acetate, acetone.

Solvent for forming a luminous layer: Xylene, toluene.

On the other hand, even though generally used EL element materials and photoresist materials are used, for example, the following combinations are not suitable in the present invention (however, each material may be a suitable material in combination with other materials.)

Buffer layer: Polyalkylthiophene derivatives, polyaniline derivatives.

Luminous layer: TPD/Alq3 having the following structure, polyvinylcarbazole+oxadiazole derivatives+fluorescent coloring matter.

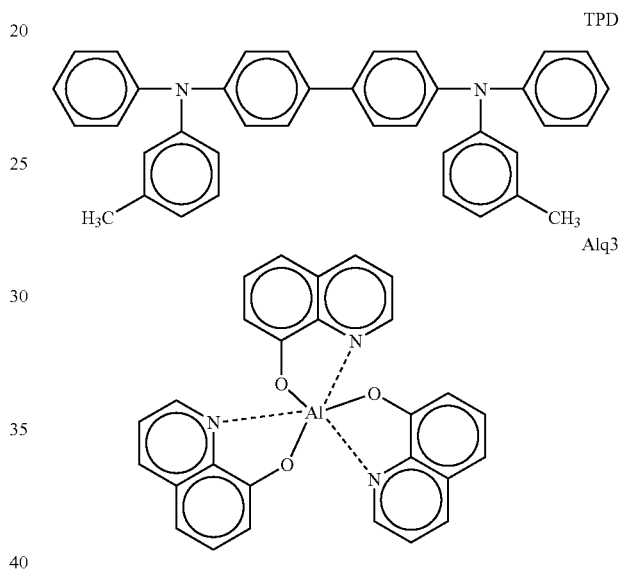

Photoresist: Positive photoresist (novolac resins).

Photoresist solvent: Cellosolve, cellosolve acetate.

Photoresist developing solution: Organic alkali developing solution.

Photoresist peeling liquid: Cellosolve, cellosolve acetate, acetone.

Solvent for forming a luminous layer: Dichloroethane (in case of TPD/Alq3, vacuum film formation.)

In the present invention, it is unsuitable to use the combination of polyvinylcarbazole+an oxadiazole derivative +fluorescent coloring matter in a luminous layer because the oxadiazole derivative and the fluorescent coloring matter will elute when the resist film is formed and peeled off. Further, it is also unsuitable to use TPD/Alq3 in a luminous layer because TPD and Alq3 elute when the resist film is formed and peeled off, TPD crystallizes by the heating process of photolithography, and other reasons.

Moreover, the present invention is not limited in the above-mentioned embodiments. The above-mentioned embodiments are illustrations. All modifications that have substantially the same constitutions as technical thoughts described in the claims of the present invention and take the same effects should be included in the technical scope of the present invention.

EXAMPLES

In the following, examples will be shown and the present invention will be further described.

Example 1

When a Luminous Layer is Made in a Single Layer (Patterning of a Buffer Layer)

A patterned ITO substrate of 3 inches square and 1.1 mm in thickness was washed and used in this example as a substrate and the first electrode layer.

The spin coating of the substrate was carried out by dropping 0.5 ml of a coating liquid for a buffer layer shown in the following chemical formula (1) (poly-3,4-ethylenedioxythiophene/polystyrenesulphonate (PEDT/PSS): made by Bayer AG (Baytron P)) in the center part of the substrate.

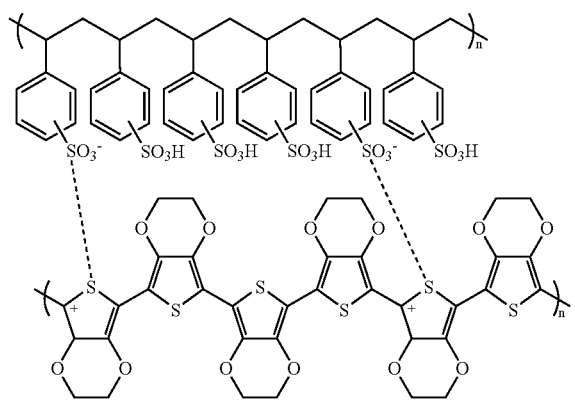

(1)

A buffer layer was formed by holding the spin coated substrate at 2500 rpm for 20 seconds, and then the buffer layer was dried at 150° C. for 5 minutes. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A resist layer was formed by holding the spin coated substrate at 500 rpm for 10 seconds and then holding at 2000 rpm for 20 seconds. As a result, the film thickness became about 1 μm. The resist layer was prebaked at 80° C. for 30 minutes. After that, the layer was set together with an exposure mask in an alignment exposure device and the part where the buffer layer should be removed was exposed to ultraviolet light. The exposed layer was developed with a resist developing solution (NMD-3 made by Tokyo Ohka Kogyo Co., Ltd.) for 20 seconds, and then washed with water to remove the photoresist and buffer layers of the exposed part. After being post baked at 120° C. for 30 minutes, all of the photoresist were removed with acetone and the buffer layer that is insoluble in acetone was formed in an optional pattern.

(Patterning of a Luminous Layer)

The spin coating of the substrate where the buffer layer had been patterned was carried out by dropping 2 ml of a 1 wt % xylene solution of luminescent polymer MEH-PPV, which is a polyparaphenylene vinylene derivative and shown in the following chemical formula (2), in the center part of the substrate.

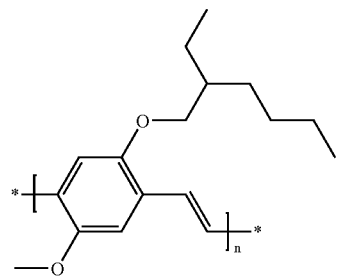

(2)

A luminous layer was formed by holding the spin coated substrate at 2000 rpm for 10 seconds, and then the luminous layer was dried at 80° C. for 1 hour. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A resist layer was formed by holding the spin coated substrate at 500 rpm for 10 seconds and then holding at 2000 rpm for 20 seconds. As a result, the film thickness became about 1 μm. The resist layer was prebaked at 80° C. for 30 minutes. After that, the layer was set together with an exposure mask in an alignment exposure device and the part where the luminous layer should be removed was exposed to ultraviolet light. The exposed layer was developed with a resist developing solution (NMD-3 made by Tokyo Ohka Kogyo Co., Ltd.) for 20 seconds, and then washed with water to remove the photoresist of the exposed part. After being post baked at 90° C. for 30 minutes, the luminous layer on the part where the photoresist had been removed was removed with toluene. All of the photoresist were removed with acetone and the luminous layer that is insoluble in acetone was formed in an optional pattern.

On the substrate obtained after drying at 90° C. for 1 hour, Ca was vapor deposited in the thickness of 500 Å as the second electrode layer (an upper electrode), and further Ag was vapor deposited in the thickness of 2500 Å as a protective layer. An EL element was thus manufactured.

Though the resolution of the obtained pattern depends on the resolving power of the positive resist, the resolution of 10 μm, which is impossible by the conventional methods of the vapor deposition mask method and the inkjet method, and the highly fine lines could be formed in this example.

(The Evaluation of the Luminous Properties of the EL Element.)

ITO electrode (the first electrode) side and Ag electrode (the second electrode) side were connected to an anode and a cathode, respectively, and were applied with direct current from a source meter. When 10 V was applied, luminescence was observed, and it was evaluated that there was no deterioration in the voltage of starting luminescence due to patterning with the use of the photolithography method. And no lowering was observed in the luminescence efficiency. Further, because of the patterning of the buffer layer, insulation properties between anode lines can be improved, resulting in the decrease in the incidence rate of crosstalk.

Example 2

When a Luminous Layer is Made in Three Layers

A buffer layer was patterned similarly to Example 1.

The spin coating of the substrate where a buffer layer had been patterned was carried out as the first luminous layer by dropping 2 ml of a 1 wt % xylene solution of luminescent polymer MEH-PPV, which is a polyparaphenylene vinylene derivative, in the center part of the substrate. A luminous layer was formed by holding the spin coated substrate at 2000 rpm for 10 seconds. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A resist layer was formed by holding the spin coated substrate at 500 rpm for 10 seconds and then holding at 2000 rpm for 20 seconds. As a result, the film thickness became about 1 μm. The resist layer was prebaked at 80° C. for 30 minutes. After that, the layer was set together with an exposure mask in an alignment exposure device and the part where the luminous layer should be removed except the luminous part of the first color was exposed to ultraviolet light. The exposed layer was developed with a resist developing solution (NMD-3 made by Tokyo Ohka Kogyo Co., Ltd.) for 20 seconds, and then washed with water to remove the photoresist of the exposed part. After being post baked at 90° C. for 30 minutes, the luminous layer on the part where the photoresist had been removed was removed with toluene. A substrate in which the first luminous part was protected with the photoresist and the buffer layer of the second and third luminous parts was exposed was obtained.

The spin coating of the substrate was carried out as the second luminous layer by dropping 2 ml of a 1 wt % xylene solution of luminescent polymer MEH-PPV, which is a polyparaphenylene vinylene derivative, in the center part of the substrate. A luminous layer was formed by holding the spin coated substrate at 2000 rpm for 10 seconds. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A resist layer was formed by holding the spin coated substrate at 500 rpm for 10 seconds and then holding at 2000 rpm for 20 seconds. As a result, the film thickness became about 1 μm. The resist layer was prebaked at 80° C. for 30 minutes. After that, the layer was set together with an exposure mask in an alignment exposure device and the part where the luminous layer should be removed except the first and second luminous parts was exposed to ultraviolet light. The exposed layer was developed with a resist developing solution (NMD-3 made by Tokyo Ohka Kogyo Co., Ltd.) for 20 seconds, and then washed with water to remove the photoresist of the exposed part. After being post baked at 90° C. for 30 minutes, the luminous layer on the part where the photoresist had been removed was removed with toluene. A substrate in which the first and second luminous parts were protected with the photoresist and the buffer layer of the third luminous part was exposed was obtained.

The spin coating of the substrate was carried out as the third luminous layer by dropping 2 ml of a 1 wt % xylene solution of luminescent polymer MEH-PPV, which is a polyparaphenylene vinylene derivative, in the center part of the substrate. A luminous layer was formed by holding the spin coated substrate at 2000 rpm for 10 seconds. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A resist layer was formed by holding the spin coated substrate at 500 rpm for 10 seconds and then holding at 2000 rpm for 20 seconds. As a result, the film thickness became about 1 μm. The resist layer was prebaked at 80° C. for 30 minutes. After that, the layer was set together with an exposure mask in an alignment exposure device and the part where the luminous layer should be removed except the first to third luminous parts was exposed to ultraviolet light. The exposed layer was developed with a resist developing solution (NMD-3 made by Tokyo Ohka Kogyo Co., Ltd.) for 20 seconds, and then washed with water to remove the photoresist of the exposed part. After being post baked at 90° C. for 30 minutes, the luminous layer on the part where the photoresist had been removed was removed with toluene. A substrate in which the first to third luminous parts were protected with the photoresist was obtained. After that, all of the photoresist were removed with acetone.

On the substrate obtained after drying at 90° C. for 1 hour, Ca was vapor deposited in the thickness of 500 Å as the second electrode layer (an upper electrode), and further Ag was vapor deposited in the thickness of 2500 Å as a protective layer. An EL element was thus manufactured.

Though the resolution of the obtained pattern depends on the resolving power of the positive resist, the resolution of 10 μm, which is impossible by the conventional methods of the vapor deposition mask method and the inkjet method, and the highly fine lines could be formed in this example.

(The Evaluation of the Luminous Properties of the EL Element.)

ITO electrode (the first electrode) side and Ag electrode (the second electrode) side were connected to an anode and a cathode, respectively, and were applied with direct current from a source meter. When 10 V was applied, luminescence was observed from each of the first to third luminous parts, and it was evaluated that there was no deterioration in the voltage of starting luminescence due to patterning with the use of the photolithography method. And no lowering was observed in the luminescence efficiency. Further, because of the patterning of the buffer layer, insulation properties between anode lines can be improved, resulting in the decrease in the incidence rate of crosstalk.

Example 3

The Change of the Solvent

An EL element was manufactured in the same way as Example 1 except that polyvinylcarbazole shown by the following chemical formula (3) was used as a luminous layer and toluene as a solvent for the luminous layer.

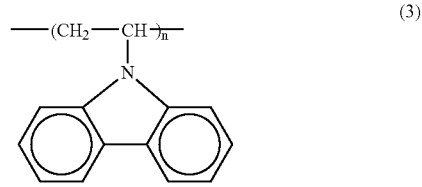

(3)

Though the resolution of the obtained pattern depends on the resolving power of the positive resist, the resolution of 10 μm, which is impossible by the conventional methods of the vapor deposition mask method and the inkjet method, and the highly fine lines could be formed in this example.

(The Evaluation of the Luminous Properties of the EL Element.)

ITO electrode (the first electrode) side and Ag electrode (the second electrode) side were connected to an anode and a cathode, respectively, and were applied with direct current from a source meter. When 15 V was applied, luminescence was observed, and it was evaluated that there was no deterioration in the voltage of starting luminescence due to patterning with the use of the photolithography method. And no lowering was observed in the luminescence efficiency. Further, because of the patterning of the buffer layer, insulation properties between anode lines can be improved, resulting in the decrease in the incidence rate of crosstalk.

Example 4

Patterning by Dry Etching (The Film Formation of a Buffer Layer.)

A patterned ITO substrate of 3 inches square and 1.1 mm in thickness was washed and used in this example as a substrate and the first electrode layer. The spin coating of the substrate was carried out by dropping 0.5 ml of a coating liquid for a buffer layer (Baytron P made by Bayer AG, and shown in the above chemical formula (1)) in the center part of the substrate. A layer was formed by holding the spin coated substrate at 2500 rpm for 20 seconds. As a result, the film thickness became 800 Å.

(Patterning of a Luminous Layer)

The spin coating of the substrate where the buffer layer had been patterned was carried out by dropping 2 ml of a 1 wt % xylene solution of luminescent polymer MEH-PPV, which is a polyparaphenylene vinylene derivative, in the center part of the substrate. A layer was formed by holding the spin coated substrate at 2000 rpm for 10 seconds. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A layer was formed by holding the spin coated substrate at 500 rpm for 10 seconds and then holding at 2000 rpm for 20 seconds. As a result, the film thickness became about 1 µm. The layer was prebaked at 80° C. for 30 minutes. After that, the layer was set together with an exposure mask in an alignment exposure device and the part where the luminous layer should be removed was exposed to ultraviolet light. The exposed layer was developed with a resist developing solution (NMD-3 made by Tokyo Ohka Kogyo Co., Ltd.) for 20 seconds, and then washed with water to remove the photoresist of the exposed part.

After being post baked at 120° C. for 30 minutes, the substrate was subjected to oxygen plasma treatment at a pressure of 150 millitorrs and with 150 W power for 20 minutes. Since the photoresist layer is 5 times or more thicker than the buffer layer and the luminous layer, only the luminous and buffer layers on the part that had not been protected with the photoresist were peeled off and ITO electrode was bared. A substrate having the first luminous part protected with the photoresist was obtained.

A coating liquid for a buffer layer was spin coated on the obtained substrate and a buffer layer of 800 Å was obtained. Then, the spin coating of the substrate was carried out as the second luminous layer by dropping 2 ml of a 1 wt % xylene solution of luminescent polymer MEH-PPV, which is a polyparaphenylene vinylene derivative, in the center part of the substrate. A layer was formed by holding the spin coated substrate at 2000 rpm for 10 seconds. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A layer was formed by holding the spin coated substrate at 500 rpm for 10 seconds and then holding at 2000 rpm for 20 seconds. As a result, the film thickness became about 1 µm. The layer was prebaked at 80° C. for 30 minutes. After that, the layer was set together with an exposure mask in an alignment exposure device and the part where the luminous layer should be removed except the luminous part of the first and second colors was exposed to ultraviolet light. The exposed layer was developed with a resist developing solution (NMD-3 made by Tokyo Ohka Kogyo Co., Ltd.) for 20 seconds, and then washed with water to remove the photoresist of the exposed part.

After being post baked at 120° C. for 30 minutes, the substrate was subjected to oxygen plasma treatment at a pressure of 150 millitorrs and with 150 W power for 20 minutes. Since the photoresist layer is 5 times or more thicker than the buffer layer and the luminous layer, only the luminous and buffer layers on the part that had not been protected with the photoresist were peeled off and ITO electrode was bared. A substrate having the first and second luminous parts protected with the photoresist was obtained.

A coating liquid for a buffer layer was spin coated on the obtained substrate and a buffer layer of 800 Å was obtained. Then, the spin coating of the substrate was carried out as the third luminous layer by dropping 2 ml of a 1 wt % xylene solution of luminescent polymer MEH-PPV, which is a polyparaphenylene vinylene derivative, in the center part of the substrate. A layer was formed by holding the spin coated substrate at 2000 rpm for 10 seconds. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A layer was formed by holding the spin coated substrate at 500 rpm for 10 seconds and then holding at 2000 rpm for 20 seconds. As a result, the film thickness became about 1 µm. The layer was prebaked at 80° C. for 30 minutes. After that, the layer was set together with an exposure mask in an alignment exposure device and the part where the luminous layer should be removed except the luminous part of the first to third colors was exposed to ultraviolet light. The exposed layer was developed with a resist developing solution (NMD-3 made by Tokyo Ohka Kogyo Co., Ltd.) for 20 seconds, and then washed with water to remove the photoresist of the exposed part.

After being post baked at 120° C. for 30 minutes, the substrate was subjected to oxygen plasma treatment at a pressure of 150 milliliters and with 150 W power for 20 minutes. Since the photoresist layer is 5 times or more thicker than the buffer layer and the luminous layer, only the luminous and buffer layers on the part that had not been protected with the photoresist were peeled off. A substrate having the first to third luminous parts protected with the photoresist was obtained. After that, all of the photoresist were removed with acetone.

On the substrate obtained after drying at 100° C. for 1 hour, Ca was vapor deposited in the thickness of 500 Å as the second electrode layer (an upper electrode), and further Ag was vapor deposited in the thickness of 2500 Å as a protective layer. An EL element was thus manufactured.

(The Evaluation of the Luminous Properties of the EL Element.)

ITO electrode side and Ag electrode side were connected to a positive electrode and a negative electrode, respectively, and were applied with direct current from a source meter.

When 10 V was applied, luminescence was observed from each of the first to third luminous parts.

Example 5

The Use of Atmospheric Plasma

An EL element was manufactured in the same way as Example 4 except for the use of atmospheric-pressure plasma instead of oxygen plasma treatment. Similarly to Example 4, the pattern could be formed, and luminescence was observed from each of the first to third luminous parts.

Example 6

The Use of an Ultrasonic Bath (The Film Formation of a Buffer Layer.)

A patterned ITO substrate of 6 inches square and 1.1 mm in thickness was washed and used as a substrate and the first electrode layer. The spin coating of the substrate was carried out by dropping 0.5 ml of a coating liquid for a buffer layer (Baytron P made by Bayer AG, and shown in the above chemical formula (1)) in the center part of the substrate. A layer was formed by holding the spin coated substrate at 2500 rpm for 20 seconds. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A layer was formed by holding the spin coated substrate at 500 rpm for 10 seconds and then holding at 2000 rpm for 20 seconds. As a result, the film thickness became about 1 μm. The layer was prebaked at 80° C. for 30 minutes. After that, the layer was set together with an exposure mask in an alignment exposure device and the part where the buffer layer should be removed was exposed to ultraviolet light. The exposed layer was developed with a resist developing solution (NMD-3 made by Tokyo Ohka Kogyo Co., Ltd.) for 20 seconds, and then washed with water to remove the photoresist and buffer layers of the exposed part. After being post baked at 120° C. for 30 minutes, all of the photoresist were removed with acetone and the buffer layer that is insoluble in acetone was formed in an optional pattern.

(The Film Formation of a Luminous Layer)

The spin coating of the substrate where the buffer layer had been patterned was carried out as the first luminous layer by dropping 2 ml of a 1 wt % xylene solution of luminescent polymer MEH-PPV, which is a polyparaphenylene vinylene derivative, in the center part of the substrate. A layer was formed by holding the spin coated substrate at 2000 rpm for 10 seconds. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A layer was formed by holding the spin coated substrate at 500 rpm for 10 seconds and then holding at 2000 rpm for 20 seconds. As a result, the film thickness became about 1 μm. The layer was prebaked at 80° C. for 30 minutes. After that, the layer was set together with an exposure mask in an alignment exposure device and the part where the luminous layer should be removed except the luminous part of the first color was exposed to ultraviolet light. The exposed layer was developed with a resist developing solution (NMD-3 made by Tokyo Ohka Kogyo Co., Ltd.) for 20 seconds, and then washed with water to remove the photoresist of the exposed part. After being post baked at 120° C. for 30 minutes, the luminous layer on the part where the photoresist had been removed was removed with toluene in an ultrasonic bath. A substrate in which the first luminous part was protected with the photoresist was obtained.

The spin coating of the substrate was carried out as the second luminous layer by dropping 2 ml of a 1 wt % xylene solution of luminescent polymer MEH-PPV, which is a polyparaphenylene vinylene derivative, in the center part of the substrate. A layer was formed by holding the spin coated substrate at 2000 rpm for 10 seconds. As a result, the film thickness became 800 Å. The second luminous layer was peeled off together with the photoresist formed on the upper part of the patterned first luminous layer by peeling off the photoresist with acetone to make the patterned first luminous layer expose.

The spin coating of the substrate was carried out by dropping 2 ml of positive photoresist liquid (OFPR-800 made by Tokyo Ohka Kogyo Co., Ltd.) in the center part of the substrate. A layer was formed by holding the spin coated substrate at 500 rpm for 10 seconds and then holding at 2000 rpm for 20 seconds. As a result, the film thickness became about 1 μm. The layer was prebaked at 80° C. for 30 minutes. After that, the layer was set together with an exposure mask in an alignment exposure device and the part where the luminous layer should be removed except the luminous parts of the first and the second color was exposed to ultraviolet light. The exposed layer was developed with a resist developing solution (NMD-3 made by Tokyo Ohka Kogyo Co., Ltd.) for 20 seconds, and then washed with water to remove the photoresist of the exposed part. After being post baked at 120° C. for 30 minutes, the luminous layer on the part where the photoresist had been removed was removed with toluene in an ultrasonic bath. A substrate in which the first and second luminous parts were protected with the photoresist was obtained.

The spin coating of the substrate was carried out as the third luminous layer by dropping 2 ml of a 1 wt % xylene solution of luminescent polymer MEH-PPV, which is a polyparaphenylene vinylene derivative, in the center part of the substrate. A layer was formed by holding the spin coated substrate at 2000 rpm for 10 seconds. As a result, the film thickness became 800 Å. The third luminous layer was peeled off together with the photoresist formed on the upper parts of the patterned first and second luminous layers by peeling off the photoresist with acetone to make the patterned first and second luminous layers expose.

The spin coating of the substrate was carried out by dropping 2 ml of positive photoresist liquid (OFPR-800 made by Tokyo Ohka Kogyo Co., Ltd.) in the center part of the substrate. A layer was formed by holding the spin coated substrate at 500 rpm for 10 seconds and then holding at 2000 rpm for 20 seconds. As a result, the film thickness became about 1 μm. The layer was prebaked at 80° C. for 30 minutes. After that, the layer was set together with an exposure mask in an alignment exposure device and the part where the luminous layer should be removed except the first to third luminous parts was exposed to ultraviolet light. The exposed layer was developed with a resist developing solution (NMD-3 made by Tokyo Ohka Kogyo Co., Ltd.) for 20 seconds, and then washed with water to remove the photoresist of the exposed part. After being post baked at 120° C. for 30 minutes, the luminous layer on the part where the photoresist had been removed was removed with toluene in an ultrasonic bath. A substrate in which the first to third luminous parts were protected with the photoresist was obtained. After that, all of the photoresist were removed with acetone to make the patterned luminous layer expose.

On the substrate obtained after drying at 100° C. for 1 hour, Ca was vapor deposited in the thickness of 500 Å as the second electrode layer (an upper electrode), and further Ag was vapor deposited in the thickness of 2500 Å as a protective layer. An EL element was thus manufactured.

(The Evaluation of the Luminous Properties of the EL Element.)

ITO electrode side and Ag electrode side were connected to a positive electrode and a negative electrode, respectively, and were applied with direct current from a source meter. When 10 V was applied, luminescence was observed from each of the first to third luminous parts.

Example 7

The Formation of an Insulation Layer

A patterned ITO substrate of 3 inches square and 1.1 mm in thickness was washed and used as a substrate and the first electrode layer. At this time, the pattern in the ITO substrate was 84 μm in line and 16 μm in space. On the above space part and the edge parts (5 μm each) of the ITO substrate, an insulation layer of 5 μm in thickness was formed in the width of 26 μm with the use of negative resist comprising of an insulative ultraviolet curing type resin. An EL element was thus formed similarly to Example 4 as far as others are concerned.

After patterning for forming the first, second and third luminous layers, the insulation layer fulfills its function as an insulation layer without being broken down and luminescence was observed from each of the first to third luminous parts. Thus, it was found that if an insulation layer was formed, it was possible to form a pattern similarly to the case of Example 4.

Example 8

A Solvent for a Luminous Layer (The Film Formation of a Buffer Layer.)

A patterned ITO substrate of 6 inches square and 1.1 mm in thickness was washed and used as a substrate and the first electrode layer. The spin coating of the substrate was carried out by dropping 0.5 ml of a coating liquid for a buffer layer (Baytron P made by Bayer AG, and shown in the above chemical formula (1)) in the center part of the substrate. A layer was formed by holding the spin coated substrate at 2500 rpm for 20 seconds. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A layer was formed by holding the spin coated substrate at 500 rpm for 10 seconds and then holding at 2000 rpm for 20 seconds. As a result, the film thickness became about 1 μm. The layer was prebaked at 80° C. for 30 minutes. After that, the layer was set together with an exposure mask in an alignment exposure device and the part where the buffer layer should be removed was exposed to ultraviolet light. The exposed layer was developed with a resist developing solution (NMD-3 made by Tokyo Ohka Kogyo Co., Ltd.) for 20 seconds, and then washed with water to remove the photoresist and buffer layers of the exposed part. After being post baked at 120° C. for 30 minutes, all of the photoresist were removed with acetone and the buffer layer that is insoluble in acetone was formed in an optional pattern.

(The Film Formation of a Luminous Layer)

The spin coating of the substrate where the buffer layer had been patterned was carried out as the first luminous layer by dropping 2 ml of a 2 wt % toluene solution of polyvinylcarbazole (shown in the above chemical formula (3)) in the center part of the substrate. A layer was formed by holding the spin coated substrate at 2000 rpm for 10 seconds. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A layer was formed by holding the spin coated substrate at 500 rpm for 10 seconds and then holding at 2000 rpm for 20 seconds. As a result, the film thickness became about 1 μm. The layer was prebaked at 80° C. for 30 minutes. After that, the layer was set together with an exposure mask in an alignment exposure device and the part where the luminous layer should be removed except the luminous part of the first luminous layer was exposed to ultraviolet light. The exposed layer was developed with a resist developing solution (NMD-3 made by Tokyo Ohka Kogyo Co., Ltd.) for 20 seconds, and then washed with water to remove the photoresist of the exposed part. After being post baked at 120° C. for 30 minutes, the luminous layer on the part where the photoresist had been removed was removed with toluene (a developer for the first luminous layer) in an ultrasonic bath. A substrate in which the first luminous part was protected with the photoresist was obtained.

The spin coating of the substrate was carried out as the second luminous layer by dropping 2 ml of a 1 wt % xylene solution of luminescent polymer MEH-PPV, which is a polyparaphenylene vinylene derivative (shown in the above chemical formula (2)), in the center part of the substrate. A layer was formed by holding the spin coated substrate at 2000 rpm for 10 seconds. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A layer was formed by holding the spin coated substrate at 500 rpm for 10 seconds and then holding at 2000 rpm for 20 seconds. As a result, the film thickness became about 1 μm. The layer was prebaked at 80° C. for 30 minutes. After that, the layer was set together with an exposure mask in an alignment exposure device and the part where the luminous layer should be removed except the luminous parts of the first and second luminous layers was exposed to ultraviolet light. The exposed layer was developed with a resist developing solution (NMD-3 made by Tokyo Ohka Kogyo Co. Ltd.) for 20 seconds, and then washed with water to remove the photoresist of the exposed part. After being post baked at 120° C. for 30 minutes, the luminous layer on the part where the photoresist had been removed was removed with xylene (a developer for the second luminous layer) in an ultrasonic bath. A substrate in which the first and second luminous parts were protected with the photoresist was obtained.

After that, all of the photoresist were removed with acetone to make the patterned luminous layer expose.

On the substrate obtained after drying at 100° C. for 1 hour, Ca was vapor deposited in the thickness of 500 Å as the second electrode layer (an upper electrode), and further Ag was vapor deposited in the thickness of 2500 Å as a protective layer. An EL element was thus manufactured.

Here, the solubility of the first luminous layer in xylene, which is a solvent for forming a luminous layer and a developer for a luminous layer in the second luminous layer, was 0.01 g/g solvent at 25° C. under 1 atmospheric pressure and the solubility of the second luminous layer was 0.1 g/g solvent.

(The Evaluation of the Luminous Properties of the EL Element.)

ITO electrode side and Ag electrode side were connected to a positive electrode and a negative electrode, respectively, and were applied with direct current from a source meter. When 10 V was applied, luminescence was observed from the second luminous layer, and when 20 V was applied, luminescence was observed from the first luminous layer. And no color mixture was caused.

Comparative Example 1

An element was manufactured similarly to examples except that the first luminous layer was formed with the use of MEH-PPV and the second luminous layer was formed with the use of polyvinylcarbazole. As a result, the first luminous layer flowed out to cause color mixture when the second layer was applied and when the second layer was developed, and no good pattern was obtained.

At this time, the solubility of the first luminous layer in toluene, which is a solvent for forming a luminous layer and a developer for a luminous layer in the first luminous layer, was 0.1 g/g solvent at 25° C. under 1 atmospheric pressure and the solubility of the second luminous layer was 0.1 g/g solvent at 25° C. under 1 atmospheric pressure.

Example 9

The Wavelength of Luminescence in a Luminouslayer (The Film Formation of a Buffer Layer.)

A patterned ITO substrate of 6 inches square and 1.1 mm in thickness was washed and used as a substrate and the first electrode layer. The spin coating of the substrate was carried out by dropping 0.5 ml of a coating liquid for a buffer layer (Baytron P made by Bayer AG, and shown in the above chemical formula (1)) in the center part of the substrate. A layer was formed by holding the spin coated substrate at 2500 rpm for 20 seconds. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A layer was formed by holding the spin coated substrate at 500 rpm for 10 seconds and then holding at 2000 rpm for 20 seconds. As a result, the film thickness became about 1 μm. The layer was prebaked at 80° C. for 30 minutes. After that, the layer was set together with an exposure mask in an alignment exposure device and the part where the buffer layer should be removed was exposed to ultraviolet light. The exposed layer was developed with a resist developing solution (NMD-3 made by Tokyo Ohka Kogyo Co., Ltd.) for 20 seconds, and then washed with water to remove the photoresist and buffer layers of the exposed part. After being post baked at 120° C. for 30 minutes, all of the photoresist were removed with acetone and the buffer layer that is insoluble in acetone was formed in an optional pattern.

(The Film Formation of a Luminous Layer)

The spin coating of the substrate where the buffer layer had been patterned was carried out as the first luminous layer by dropping 2 ml of a 2 wt % toluene solution of polyvinylcarbazole (shown in the above chemical formula (3)), a blue color luminescent material, in the center part of the substrate. A layer was formed by holding the spin coated substrate at 2000 rpm for 10 seconds. As a result, the film thickness became 800 Å.

The spin coating of the substrate was carried out by dropping 2 ml of positive photoresist liquid (OFPR-800 made by Tokyo Ohka Kogyo Co., Ltd.) in the center part of the substrate. A layer was formed by holding the spin coated substrate at 500 rpm for 10 seconds and then holding at 2000 rpm for 20 seconds. As a result, the film thickness became about 1 μm. The layer was prebaked at 80° C. for 30 minutes. After that, the layer was set together with an exposure mask in an alignment exposure device and the part where the luminous layer should be removed except the luminous part of the first luminous layer was exposed to ultraviolet light. The exposed layer was developed with a resist developing solution (NMD-3 made by Tokyo Ohka Kogyo Co., Ltd.) for 20 seconds, and then washed with water to remove the photoresist of the exposed part. After being post baked at 120° C. for 30 minutes, the luminous layer on the part where the photoresist had been removed was removed with toluene in an ultrasonic bath. A substrate in which the first luminous layer was protected with the photoresist was obtained.

The spin coating of the substrate was carried out as the second luminous layer by dropping 2 ml of a 1 wt % toluene solution of luminescent polymer MEH-PPV, which is an orange color luminescent material and a polyparaphenylene vinylene derivative (shown in the above chemical formula (2)), in the center part of the substrate. A layer was formed by holding the spin coated substrate at 2000 rpm for 10 seconds. As a result, the film thickness became 800 Å. The second luminous layer was peeled off together with the photoresist formed on the upper parts of the patterned first luminous layer by peeling off the photoresist with acetone to make the patterned first luminous layer expose.

The spin coating of the substrate was carried out by dropping 2 ml of positive photoresist liquid (OFPR-800 made by Tokyo Ohka Kogyo Co., Ltd.) in the center part of the substrate. A layer was formed by holding the spin coated substrate at 500 rpm for 10 seconds and then holding at 2000 rpm for 20 seconds. As a result, the film thickness became about 1 μm. The layer was prebaked at 80° C. for 30 minutes. After that, the layer was set together with an exposure mask in an alignment exposure device and the part where the luminous layer should be removed except the luminous parts of the first and second luminous layers was exposed to ultraviolet light. The exposed layer was developed with a resist developing solution (NMD-3 made by Tokyo Ohka Kogyo Co., Ltd.) for 20 seconds, and then washed with water to remove the photoresist of the exposed part. After being postbaked at 120° C. for 30 minutes, the luminous layer on the part where the photoresist had been removed was removed with toluene in an ultrasonic bath. A substrate in which the first and second luminous parts were protected with the photoresist was obtained.

After that, all of the photoresist were removed with acetone to make the patterned luminous layer expose.

On the substrate obtained after drying at 100° C. for 1 hour, Ca was vapor deposited in the thickness of 500 Å as the second electrode layer (an upper electrode), and further Ag was vapor deposited in the thickness of 2500 Å as a protective layer. An EL element was thus manufactured.

(The Evaluation of the Luminous Properties of the EL Element.)

ITO electrode side and Ag electrode side were connected to a positive electrode and a negative electrode, respectively, and were applied with direct current from a source meter. When 20 V was applied, luminescence with a peak wavelength around 430 nm resulting from polyvinylcarbazole was observed from the first luminous layer, and when 10 V was applied, luminescence with a peak wavelength around 590 nm resulting from MEH-PPV was observed from the second luminous layer.

At this time, it is expected that part of polyvinylcarbazole flows out in the second luminous layer from the edge part of the first luminous layer and mixes with MEH-PPV at the luminous part of the second luminous layer, however no luminescence resulting from polyvinylcarbazole was observed.

Comparative Example 2

An element was manufactured similarly to examples except that the first luminous layer was formed with the use of MEH-PPV and the second luminous layer was formed with the use of polyvinylcarbazole.

ITO electrode side and Ag electrode side were connected to a positive electrode and a negative electrode, respectively, and were applied with direct current from a source meter. When 10 V was applied, luminescence with a peak wavelength around 590 nm resulting from MEH-PPV was observed from the first luminous layer, and when 10 V was applied, luminescence with two peaks around 430 and 590 nm resulting from polyvinylcarbazole and MEH-PPV, respectively, was observed from the second luminous layer.

The cause was that when the second luminous layer was applied, MEH-PPV flowed out from the edge part of the already patterned first luminous layer and mixed with polyvinylcarbazole to cause color mixture at the luminous part in the second luminous layer.

What is claimed is:

1. An electroluminescent element comprising:
a substrate;
an electrode layer formed on said substrate in the form of a pattern;
an insulating layer that is formed to cover an edge part of said electrode layer and a non-luminous portion of the element so that a luminous portion is open; and
at least one patterned organic electroluminescent layer formed on said electrode layer,
wherein the electroluminescent element does not have any one of a partition, a structure aiding patterning of said organic electroluminescent layer, and surface treatment aiding patterning of said organic electroluminescent layer, and wherein said organic electroluminescent layer is formed by a polymer material with a wet process and patterned.

* * * * *